US011227862B2

(12) United States Patent
Sasaki et al.

(10) Patent No.: US 11,227,862 B2
(45) Date of Patent: Jan. 18, 2022

(54) SEMICONDUCTOR DEVICE

(71) Applicant: Murata Manufacturing Co., Ltd., Kyoto-fu (JP)

(72) Inventors: Kenji Sasaki, Nagaokakyo (JP); Takayuki Tsutsui, Nagaokakyo (JP); Isao Obu, Nagaokakyo (JP); Yasuhisa Yamamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 9 days.

(21) Appl. No.: 16/921,379

(22) Filed: Jul. 6, 2020

(65) Prior Publication Data

US 2020/0335491 A1 Oct. 22, 2020

Related U.S. Application Data

(63) Continuation-in-part of application No. 16/219,886, filed on Dec. 13, 2018, now Pat. No. 10,707,200.
(Continued)

(30) Foreign Application Priority Data

Feb. 28, 2017 (JP) .................. 2017-035871
Jul. 21, 2017 (JP) .................. 2017-142136

(51) Int. Cl.
*H01L 27/02* (2006.01)
*H01L 23/00* (2006.01)
(Continued)

(52) U.S. Cl.
CPC .......... *H01L 27/0255* (2013.01); *H01L 24/05* (2013.01); *H01L 24/06* (2013.01);
(Continued)

(58) Field of Classification Search
CPC ..... H01L 27/0255; H01L 24/05; H01L 24/06; H01L 24/17; H01L 24/49; H01L 29/0692;
(Continued)

(56) References Cited

U.S. PATENT DOCUMENTS 5,963,467 A 10/1999 Miyatake et al.
6,636,118 B1 10/2003 Kusano et al.
(Continued)

FOREIGN PATENT DOCUMENTS

JP 4977313 B2 7/2012
KR 2006-0092093 A 8/2006
KR 2012-0047741 A 5/2012

*Primary Examiner* — Nathan W Ha
(74) *Attorney, Agent, or Firm* — Studebaker & Brackett PC

(57) ABSTRACT

An amplifier circuit including a semiconductor element is formed on a substrate. A protection circuit is formed including a plurality of protection diodes that are formed on the substrate and that are connected in series with each other, the protection circuit being connected to an output terminal of the amplifier circuit. A pad conductive layer is formed that at least partially includes a pad for connecting to a circuit outside the substrate. An insulating protective film covers the pad conductive layer. The insulating protective film includes an opening that exposes a partial area of a surface of the pad conductive layer, and that covers another area. A first bump is formed on the pad conductive layer on a bottom surface of the opening, and a second bump at least partially overlaps the protection circuit in plan view and is connected to a ground (GND) potential connected to the amplifier circuit.

15 Claims, 29 Drawing Sheets

Related U.S. Application Data which is a continuation of application No. 15/902,815, filed on Feb. 22, 2018, now Pat. No. 10,192,862.

(51) Int. Cl.

| | |
|---|---|
| *H01L 29/423* | (2006.01) |
| *H01L 29/08* | (2006.01) |
| *H01L 29/10* | (2006.01) |
| *H01L 29/417* | (2006.01) |
| *H03F 1/52* | (2006.01) |
| *H03F 3/195* | (2006.01) |
| *H01L 29/861* | (2006.01) |
| *H01L 29/06* | (2006.01) |
| *H01L 29/737* | (2006.01) |
| *H03F 3/213* | (2006.01) |

(52) U.S. Cl.
CPC .............. *H01L 24/17* (2013.01); *H01L 24/49* (2013.01); *H01L 29/0692* (2013.01); *H01L 29/0821* (2013.01); *H01L 29/1004* (2013.01); *H01L 29/41708* (2013.01); *H01L 29/42304* (2013.01); *H01L 29/7371* (2013.01); *H01L 29/8613* (2013.01); *H03F 1/52* (2013.01); *H03F 3/195* (2013.01); *H03F 3/213* (2013.01); *H01L 24/13* (2013.01); *H01L 24/48* (2013.01); *H01L 2224/02166* (2013.01); *H01L 2224/0401* (2013.01); *H01L 2224/04042* (2013.01); *H01L 2224/13082* (2013.01); *H01L 2224/13101* (2013.01); *H01L 2224/13144* (2013.01); *H01L 2224/48463* (2013.01); *H01L 2924/00014* (2013.01); *H03F 2200/444* (2013.01)

(58) Field of Classification Search
CPC .............. H01L 29/0821; H01L 29/1004; H01L 29/41708; H01L 29/42304; H01L 29/7371; H01L 29/8613
See application file for complete search history.

(56) References Cited

U.S. PATENT DOCUMENTS

| | | |
|---|---|---|
| 9,397,084 B1 | 7/2016 | Li et al. |
| 9,698,137 B2 | 7/2017 | Zampardi et al. |
| 10,192,862 B2 | 1/2019 | Sasaki et al. |
| 2001/0015676 A1 | 8/2001 | Takikawa et al. |
| 2005/0017267 A1* | 1/2005 | Kawasaki ............ H01L 29/045 257/197 |
| 2005/0023643 A1* | 2/2005 | Li ....................... H01L 23/4821 257/565 |
| 2005/0156194 A1 | 7/2005 | Ohbu et al. |
| 2006/0180864 A1 | 8/2006 | Suzuki et al. |
| 2007/0164316 A1 | 7/2007 | Ohbu et al. |
| 2007/0202832 A1 | 8/2007 | Takikawa et al. |
| 2009/0261444 A1 | 10/2009 | Yamazaki et al. |
| 2009/0321869 A1 | 12/2009 | Fukuoka et al. |
| 2010/0327980 A1 | 12/2010 | Ohbu et al. |
| 2012/0098120 A1 | 4/2012 | Yu et al. |
| 2013/0001792 A1 | 1/2013 | Uno et al. |
| 2013/0049137 A1 | 2/2013 | Uno et al. |
| 2013/0082334 A1 | 4/2013 | Nakamura et al. |
| 2016/0268978 A1 | 9/2016 | Matsuno |
| 2016/0294379 A1 | 10/2016 | Hayashiguchi et al. |
| 2017/0217757 A1 | 8/2017 | Deas et al. |
| 2017/0271399 A1 | 9/2017 | Lee et al. |
| 2017/0331371 A1 | 11/2017 | Parto |
| 2017/0374442 A1 | 12/2017 | Pennock et al. |
| 2018/0104499 A1 | 4/2018 | Parramon et al. |
| 2018/0108620 A1* | 4/2018 | Petzold ............... H01L 23/5283 |
| 2018/0190639 A1 | 7/2018 | Hill |

* cited by examiner

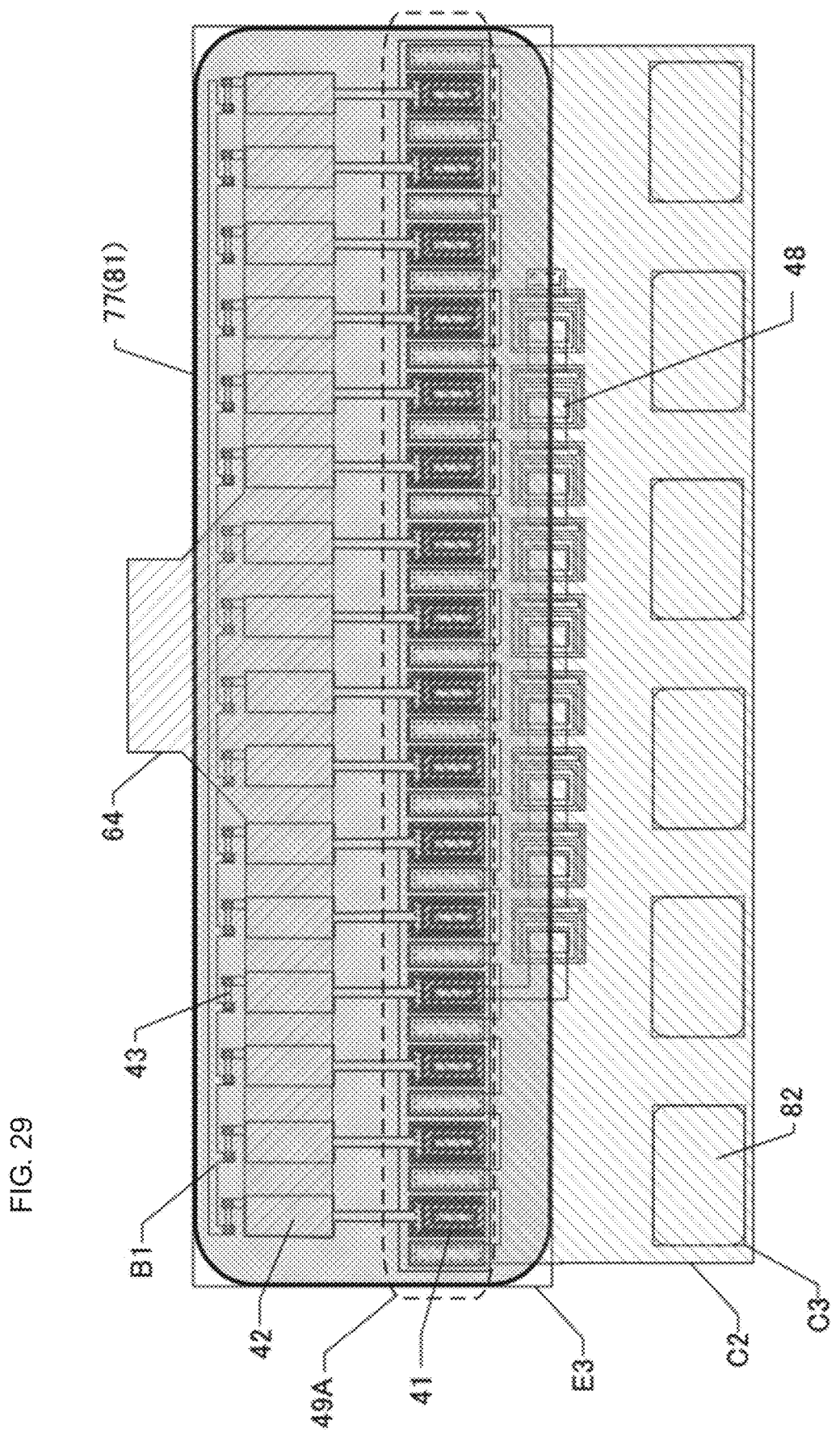

SEMICONDUCTOR DEVICE

CROSS-REFERENCE TO RELATED APPLICATIONS

This application is a Continuation-in-Part of U.S. patent application Ser. No. 16/219,886 filed Dec. 13, 2018, which is a Continuation of U.S. application Ser. No. 15/902,815 filed Feb. 22, 2018, which claims benefit of priority to Japanese Patent Application No. 2017-035871, filed Feb. 28, 2017, and to Japanese Patent Application No. 2017-142136, filed Jul. 21, 2017, the entire content of each is incorporated herein by reference.

BACKGROUND

Technical Field

The present disclosure relates to a semiconductor device.

Background Art

The heterojunction bipolar transistor (HBT) is mainly used as a transistor included in a radio-frequency (RF) amplifier module of a mobile terminal in recent years. A semiconductor device including an electrostatic breakdown prevention circuit (protection circuit) connected between the collector and the emitter of the HBT is known (Japanese Patent No. 4977313). The protection circuit includes a plurality of diodes that are connected in series with each another.

The diodes constituting the protection circuit are designed so as to satisfy the condition of conducting no electricity during normal function operation and conducting electricity when a voltage exceeding the upper limit value of voltage allowed between the collector and the emitter occurs. To satisfy this condition, eight or more diodes that are connected in series are used as the protection circuit. Because an area for arranging eight or more diodes is necessary, the chip area becomes larger.

SUMMARY

Accordingly, the present disclosure provides a semiconductor device capable of suppressing an increase in the chip area even when a protection circuit is incorporated in an amplifier circuit.

According to preferred embodiments of the present disclosure, a semiconductor device includes: an amplifier circuit including a semiconductor element formed on a substrate; a protection circuit including a plurality of protection diodes that are formed on the substrate and that are connected in series with each other, the protection circuit being connected to an output terminal of the amplifier circuit; and a pad conductive layer at least partially including a pad for connecting to a circuit outside the substrate. An insulating protective film covers the pad conductive layer, wherein the insulating protective film includes an opening that exposes a partial area of a surface of the pad conductive layer, and wherein the insulating protective film covers another area. A first bump is formed on the pad conductive layer on a bottom surface of the opening, and a second bump at least partially overlaps the protection circuit in plan view and is connected to a ground (GND) potential connected to the amplifier circuit.

In at least some embodiments, the pad conductive layer and the protection circuit may be arranged to partially overlap each other, which may reduce the chip area.

In at least some embodiments, the semiconductor device may further include a ground conductor formed on the substrate, and the protection circuit may be connected between the output terminal of the amplifier circuit and the ground conductor. A high voltage that occurs at the output terminal can be released to the ground conductor through the protection circuit.

In at least some embodiments, the opening and the protection circuit may at least partially overlap each other in plan view.

In at least some embodiments, a pad conductive layer exposed in the opening provided in the protection film operates as a pad for wire-bonding or bump. Since the pad and the protection circuit at least partially overlap each other, an increase in the chip area can be suppressed.

In at least some embodiments, using the bump, the semiconductor device can be face-down mounted on the module substrate. In the semiconductor device, the planar shape of the bump may be substantially rectangular with rounded corners. Since the planar shape of the bump is substantially rectangular with rounded corners, the bump can be processed stably to have substantially the same shape as a bump mask shape.

In at least some embodiments, part of the protection circuit may be arranged outside the pad conductive layer. Even when the entire area of the diode array cannot be accommodated inside the pad conductive layer and part of the diode array protrudes from the pad conductive layer, the area of the protrusion from the pad conductive layer can be reduced.

In at least some embodiments, each of the plurality of protection diodes may include a first semiconductor layer of a first conductivity type, a second semiconductor layer of a second conductivity type that is opposite to the first conductivity type, the second semiconductor layer being formed in a partial area of an upper surface of the first semiconductor layer, and a first electrode that is ohmic-connected to the upper surface of the first semiconductor layer; and the first electrode may have a substantially U-shaped planar shape in which the second semiconductor layer is held in the width direction of the diode array in plan view.

In at least some of these embodiments, electrostatic discharge becomes less likely to occur in response to application of a high voltage to the diode array. Accordingly, the destruction of the protection diode can be suppressed.

In at least some embodiments, the semiconductor element may be formed of compound semiconductor. The operating frequency can be made higher, compared to semiconductor devices made of silicon.

In at least some embodiments, the second bump may at least partially overlap a transistor included in the amplifier circuit.

In at least some embodiments, at least one of the bumps may be formed in an ellipse shape.

In at least some embodiments, the plurality of protection diodes may form a diode array folded back in a middle of the diode array in plan view, and part of the protection circuit may be arranged outside the second bump.

In at least some embodiments, the plurality of protection diodes may form a diode array of diodes that are aligned with one another, and part of the protection circuit may be arranged outside the second bump.

In at least some embodiments, the first bump may be arranged parallel to the second bump.

In at least some embodiments, the semiconductor device may further include a third bump, the third bump being arranged parallel to one or both of the first bump or the second bump.

Other features, elements, characteristics, and advantages of the present disclosure will become more apparent from the following detailed description of preferred embodiments of the present disclosure with reference to the attached drawings.

BRIEF DESCRIPTION OF THE DRAWINGS

FIG. 29 is a plan view of a semiconductor device according to the seventh embodiment.

DETAILED DESCRIPTION

First Embodiment

Referring to FIGS. 1A to 5, a semiconductor device according to a first embodiment will be described.

Figure 1A:
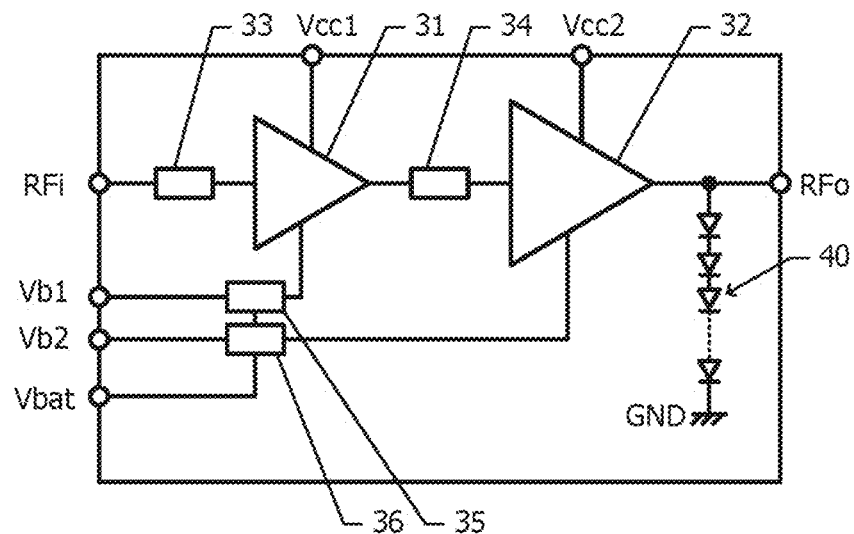
FIG. 1A is a block diagram of a power amplifier module including a semiconductor device according to a first embodiment.

FIG. 1A is a block diagram of a power amplifier module including a semiconductor device according to the present embodiment. An input signal input from an RF input terminal RFi is input to an input-stage amplifier circuit 31 via a matching circuit 33. The signal amplified by the input-stage amplifier circuit 31 is input to an output-stage amplifier circuit 32 via a matching circuit 34. The output signal amplified by the output-stage amplifier circuit 32 is output from an RF output terminal RFo.

A bias voltage terminal Vbat applies bias voltage to bias circuits 35 and 36. On the basis of a signal input from a bias control terminal Vb1, the bias circuit 35 supplies bias current to the input-stage amplifier circuit 31. On the basis of a signal input from a bias control terminal Vb2, the bias circuit 36 supplies bias current to the output-stage amplifier circuit 32. A power supply voltage is applied from a power terminal Vcc1 to the input-stage amplifier circuit 31, and a power supply voltage is applied from a power terminal Vcc2 to the output-stage amplifier circuit 32.

A protection circuit 40 is connected between an output terminal of the output-stage amplifier circuit 32 and ground GND. The protection circuit 40 has the function of suppressing a further increase of voltage when a voltage exceeding the upper limit value occurs at the output terminal of the output-stage amplifier circuit 32 due to fluctuation of a load on the power amplifier module.

Figure 1B:
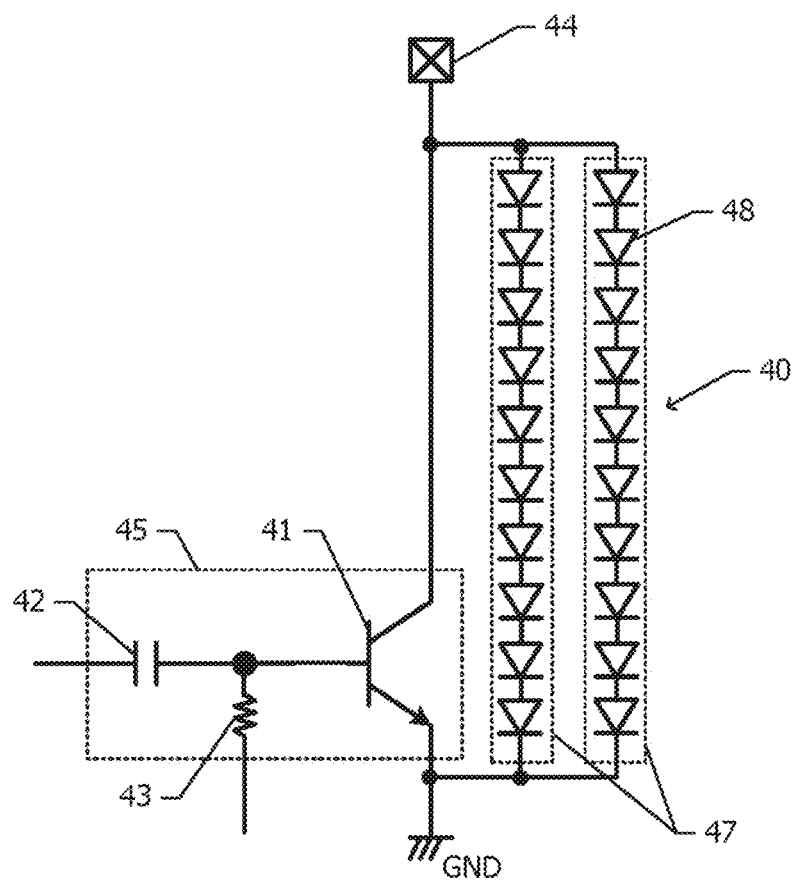
FIG. 1B is an equivalent circuit diagram of an output-stage amplifier circuit and a protection circuit.

FIG. 1B is an equivalent circuit diagram of the output-stage amplifier circuit 32 (FIG. 1A) and the protection circuit 40. An RF input signal is input to the base of a heterojunction bipolar transistor (HBT) 41 via an input capacitor 42. A bias current is supplied to the HBT 41 via a ballast resistor 43. The emitter of the HBT 41 is grounded.

A collector terminal (corresponding to the RF output terminal RFo in FIG. 1A) 44 of the HBT 41 is dropped to the ground GND with the protection circuit 40 interposed therebetween.

Although the equivalent circuit diagram illustrated in FIG. 1B illustrates one circuit unit 45 including the HBT 41, the input capacitor 42, and the ballast resistor 43, actually a plurality of circuit units 45 having the same configuration are connected in parallel.

The protection circuit 40 includes a plurality of, such as two, diode series circuits 47, which are connected in parallel. Each of the diode series circuits 47 includes a plurality of, such as ten, protection diodes 48, which are connected in series. The protection diodes 48 are connected such that the direction from the collector terminal 44 to the ground GND will be the forward direction. The protection circuit 40 conducts no electricity in normal operation, but conducts electricity when a voltage exceeding the upper limit value occurs at the collector terminal 44. Accordingly, a further increase of the voltage occurring at the collector terminal 44 is suppressed.

Figure 2:
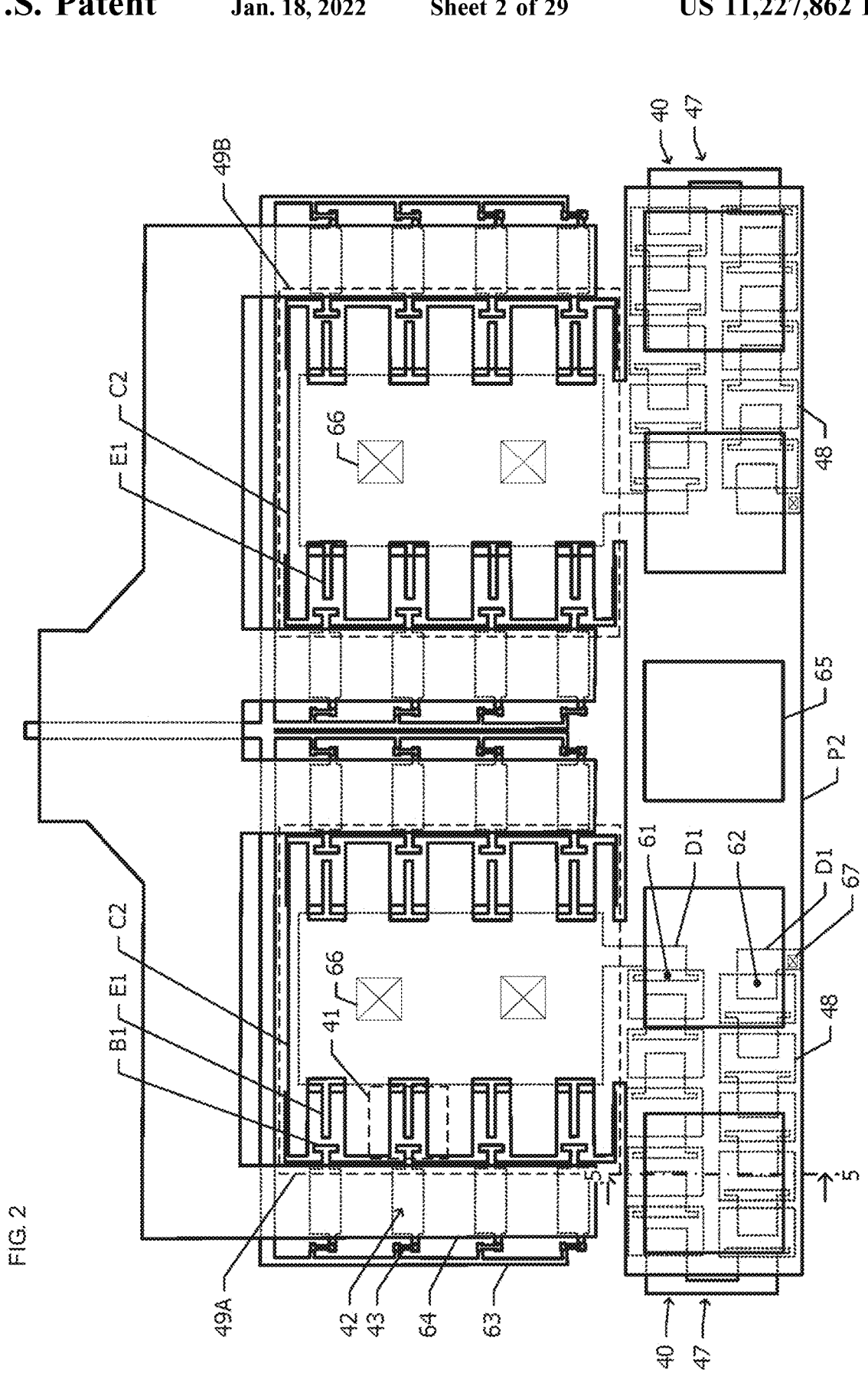
FIG. 2 is a plan view of the output-stage amplifier circuit.

FIG. 2 is a plan view of the output-stage amplifier circuit 32 (FIG. 1A). Sixteen HBTs 41 are arranged in a matrix of four rows and four columns Eight HBTs 41 positioned in the first column and the second column constitute a first HBT cell block 49A, and eight HBTs 41 positioned in the third column and the fourth column constitute a second HBT cell block 49B. The input capacitor 42 and the ballast resistor 43 are arranged corresponding to each of the HBTs 41. One diode series circuit 47 is arranged corresponding to the first HBT cell block 49A, and the other diode series circuit 47 is arranged corresponding to the second HBT cell block 49B. Each of the diode series circuits 47 includes the protection diodes 48.

Next, referring to FIGS. 3A and 3B, the configuration of each of the HBTs 41 (FIG. 2) will be described.

Figure 3A:
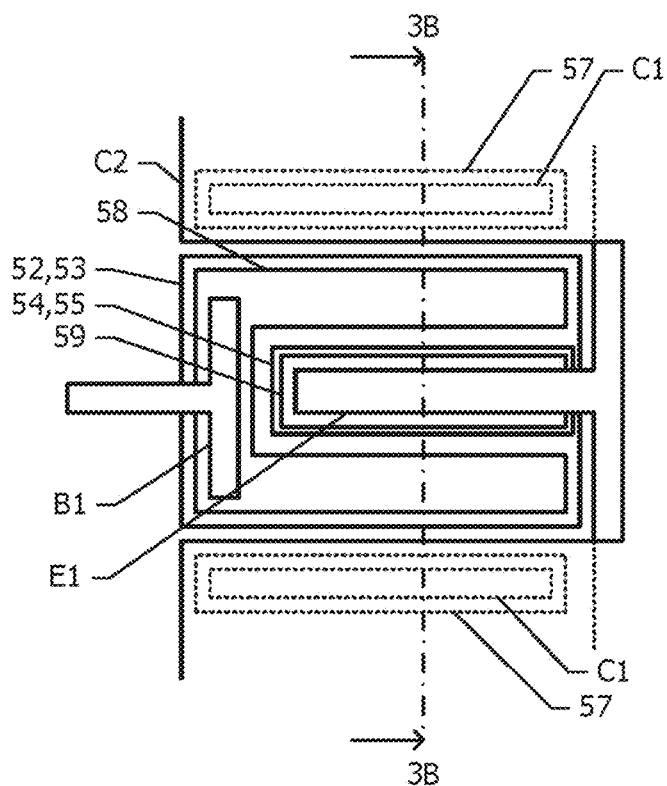
FIG. 3A is a plan view of an HBT used in the semiconductor circuit according to the first embodiment.

FIG. 3A is a plan view of the HBT 41. FIG. 3B is a sectional view taken along the dash-dotted line 3B-3B of FIG. 3A. A sub-collector layer 51 is formed on part of the upper surface of a substrate 50 made of GaAs, which is semi-insulating. A collector layer 52 is formed on part of the upper surface of the sub-collector layer 51, and a base layer 53 is formed on the collector layer 52. An emitter layer 54 is formed on part of the upper surface of the base layer 53, and an n-type semiconductor layer 55 is formed on the emitter layer 54. A pair of collector electrodes 57 is formed on the upper surface of the sub-collector layer 51. A base electrode 58 is formed on the base layer 53. An emitter electrode 59 is formed on the n-type semiconductor layer 55. The collector electrodes 57 are ohmic-connected to the sub-collector layer 51, and the base electrode 58 is ohmic-connected to the base layer 53. The emitter electrode 59 is ohmic-connected to the emitter layer 54 with the n-type semiconductor layer 55 interposed therebetween.

As illustrated in FIG. 3A, the base electrode 58 surrounds the emitter electrode 59 from three directions in plan view, and has a substantially U-shaped planar shape that opens to one direction (the rightward direction in FIG. 3A). The paired collector electrodes 57 are arranged on both sides (the upper side and the lower side in FIG. 3A) of the base layer 53.

A collector wire C1 is formed on each of the paired collector electrodes 57. A base wire B1 is formed on the base electrode 58. The base wire B1 is arranged on a base portion of the substantially U-shaped base electrode 58, which connects two arm portions of the substantially U-shaped base electrode 58. The base wire B1 is represented by a broken line in FIG. 3B because the base wire B1 does not appear in the cross section illustrated in FIG. 3B. The base wire B1 extends in a direction away from the emitter electrode 59 (the leftward direction in FIG. 3A). An emitter wire E1 is formed on the emitter electrode 59. The emitter wire E1 extends in a direction away from the base wire B1 (the rightward direction in FIG. 3A). The collector wires C1, the base wire B1, and the emitter wire E1 are formed of a metal line layer serving as the first layer.

A collector wire C2 on the second layer is formed on the collector wires C1. The collector wire C2 on the second layer is connected to the collector wires C1 on the first layer via contact holes provided in an inter-layer insulating film. Two portions of the collector wire C2 extend from the places where the paired collector wires C1 are arranged, in the same direction as the emitter wire E1 (the rightward direction in FIG. 3A), and then are integrated. In FIG. 3B, broken lines represented between the left and right portions of the collector wire C2 mean that these portions of the collector wire C2 are integrated at a place other than the cross section illustrated in FIG. 3B.

A back-surface electrode 60 is formed on the back surface of the substrate 50. The back-surface electrode 60 is connected to the emitter wire E1 via a via hole penetrating through the substrate 50 in an area other than the cross section illustrated in FIG. 3B. In the present specification, the term "via hole" refers to a hole for connecting the back-surface electrode 60 on the substrate 50 and conductor layers and wires on the front side of the substrate 50. In contrast, the term "contact hole" refers to a hole for connecting a wiring layer serving as the first layer and a wiring layer serving as the second layer.

Next, referring to FIGS. 4A and 4B, the configuration of each of the protection diodes 48 (FIG. 2) will be described.

Figure 4A:
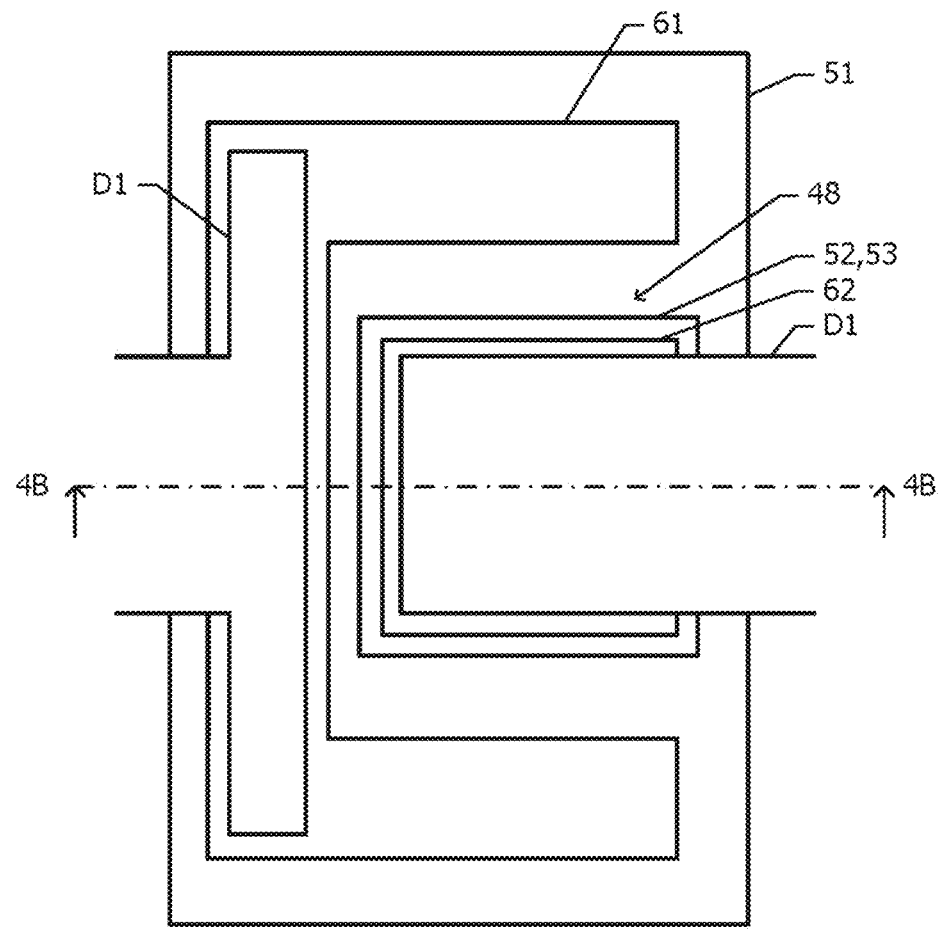
FIG. 4A is a plan view of a protection diode used in the semiconductor circuit according to the first embodiment.

FIG. 4A is a plan view of the protection diode 48. FIG. 4B is a sectional view taken along the dash-dotted line 4B-4B of FIG. 4A.

The protection diode 48 is constituted of the sub-collector layer 51, which is formed on the substrate 50, the collector layer 52, which is formed on part of the upper surface of the sub-collector layer 51, and the base layer 53. A pn junction between the collector layer 52 and the base layer 53 functions as a diode.

A cathode electrode 61 is formed on the sub-collector layer 51, and an anode electrode 62 is formed on the base layer 53. The cathode electrode 61 has the same multilayer structure as the collector electrodes 57 (FIG. 3B). The anode electrode 62 has the same multilayer structure as the base electrode 58 (FIG. 3B). Diode wires D1 are connected to the cathode electrode 61 and the anode electrode 62, respectively.

In plan view, the cathode electrode 61 (FIG. 4A) has a substantially U-shaped planar shape into which the base layer 53 is held in the width direction of a diode array and opens to the right in FIG. 4A. The diode wire D1 connected to the anode electrode 62 extends in a direction to which the cathode electrode 61 opens, and is connected to the cathode electrode 61 of the right-adjacent protection diode 48. The diode wire D1 connected to the cathode electrode 61 extends in a direction opposite to the direction to which the cathode electrode 61 opens, and is connected to the anode electrode 62 of the left-adjacent protection diode 48.

As illustrated in FIG. 2, the collector wire C2 connected to the HBTs 41 of the first HBT cell block 49A is continuous with a conductive plane arranged in an area between the HBTs 41 in the first column and the HBTs 41 in the second column. The conductive plane constitutes part of the collector wire C2. A conductive plane that constitutes the emitter wire E1 on the first layer is arranged below the conductive plane constituting the collector wire C2. This conductive plane constituting the emitter wire E1 is connected to the emitter electrodes 59 of the eight HBTs 41 included in the first HBT cell block 49A (FIGS. 3A and 3B). The conductive plane constituting the emitter wire E1 is connected to the back-surface electrode 60 (FIG. 3B) through via holes 66 penetrating through the substrate 50. Similarly for the second HBT cell block 49B, a conductive plane that constitutes the collector wire C2 and a conductive plane that constitutes the emitter wire E1 are arranged likewise.

An RF input wire 64 is arranged along each column of the HBTs 41 and is continuous with a conductive plane that is common at an end portion. The RF input wire 64 is formed of the same wiring layer as the collector wire C2 on the second layer.

The base wire B1 of each of the HBTs 41 is connected to a base control wire 63 with the ballast resistor 43 interposed therebetween after crossing the RF input wire 64. The intersection of the base wire B1 and the RF input wire 64 operates as the input capacitor 42 (FIG. 1B). The base control wire 63 is formed of the same wiring layer as the emitter wire E1 on the first layer.

A pad conductive layer P2 is arranged to be adjacent to both the first HBT cell block 49A and the second HBT cell block 49B (on the lower side in FIG. 2). The pad conductive layer P2 is formed of the wiring layer serving as the second layer, and is continuous with the collector wire C2 on the second layer. Portions of the pad conductive layer P2 are used as pads 65. Specifically, openings are formed in portions of a protective film covering the pad conductive layer P2, and portions exposed in the openings correspond to the pads 65. Here, the term "pad conductive layer" refers to a conductive layer arranged for forming pads, and a wiring conductor for transmitting an electric signal to the pads is not included in the pad conductive layer. For example, the pad conductive layer P2 is constituted of an area that has a two-dimensional spread where pads can be arranged.

The pair of diode series circuits 47 constituting the protection circuit 40 (FIG. 1B) is arranged below the pad conductive layer P2. One diode series circuit 47 is arranged corresponding to the first HBT cell block 49A, and the other diode series circuit 47 is arranged corresponding to the second HBT cell block 49B. The diode series circuits 47 have a planar shape folded back at the halfway point.

An end portion on the upstream side of current flowing through each diode series circuit 47 in the forward direction is referred to as an upstream end, and an end portion on the downstream side is referred to as a downstream end. The diode wire D1 connected to the cathode electrode 61 (FIGS. 4A and 4B) at the downstream end of each diode series circuit 47 is continuous with the emitter wire E1. The diode wire D1 connected to the anode electrode 62 (FIGS. 4A and 4B) at the upstream end of each diode series circuit 47 is connected to the pad conductive layer P2 on the second layer via the interior of a contact hole 67.

In the first embodiment, in plan view, the pad conductive layer P2 at least partially overlaps the protection diodes 48 constituting the protection circuit 40, and a pad-on-element (POE) structure is adopted.

Figure 5:
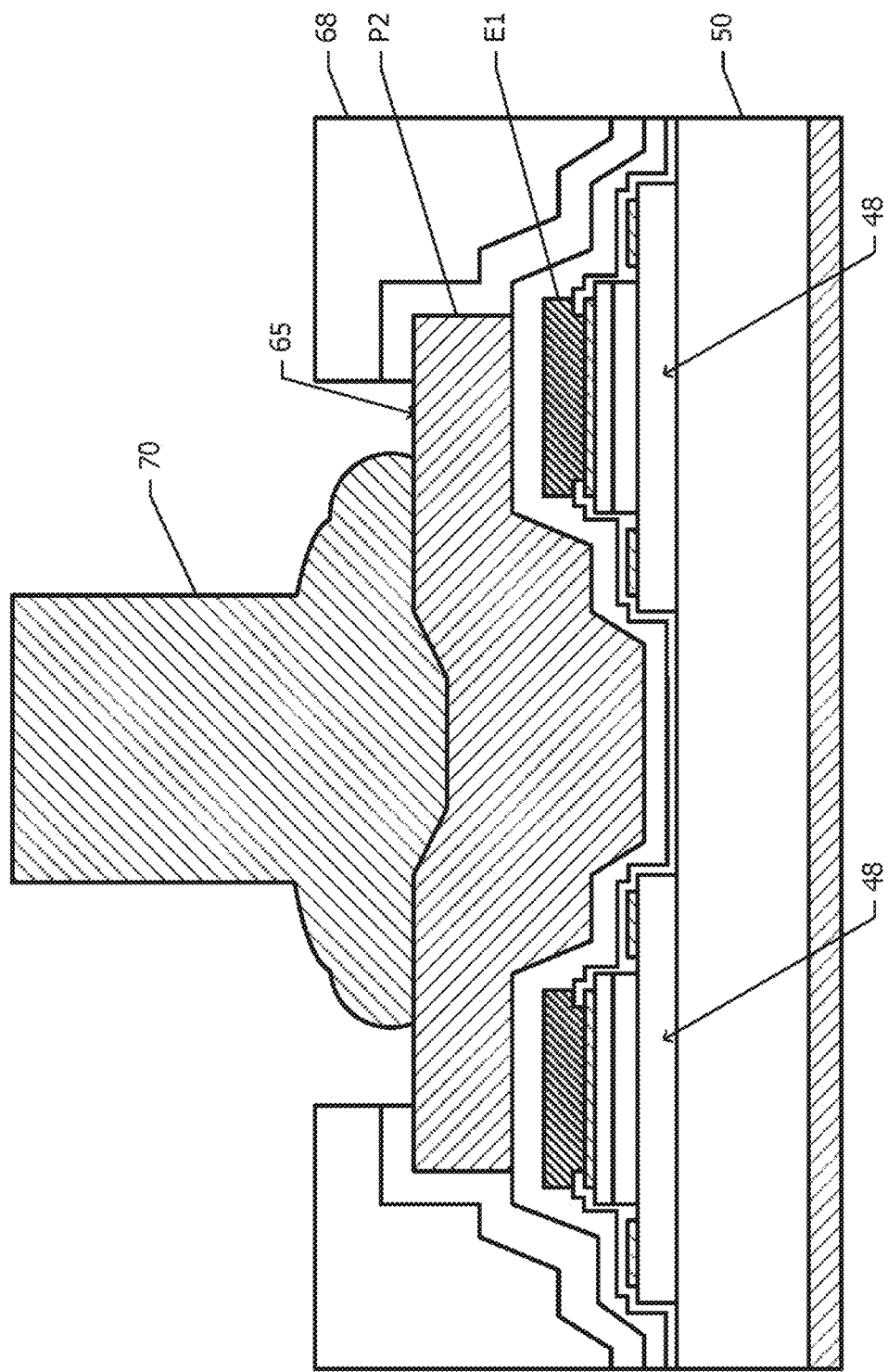
FIG. 5 is a sectional view taken along the dash-dotted line 5-5 of FIG. 2.

FIG. 5 is a sectional view taken along the dash-dotted line 5-5 of FIG. 2. The protection diodes 48 are formed on the substrate 50. The pad conductive layer P2 is formed on an inter-layer insulating film covering the protection diodes 48. A protective film 68 is formed so as to cover the pad conductive layer P2 and the other area on the substrate 50. Part of the upper surface of the pad conductive layer P2 is exposed from the bottom surface of an opening formed in the protective film 68. The exposed portion corresponds to the pad 65. A bonding wire 70 is bonded to the pad 65.

For example, silicon nitride (SiN) is used for an inter-layer insulating film between a wiring layer serving as the first layer, which includes the emitter wire E1 and so forth, and the substrate 50, and for an inter-layer insulating film between a wiring layer serving as the second layer, which includes the pad conductive layer P2 and so forth, and the wiring layer serving as the first layer. For example, insulating resin such as polyimide is used for the protective film 68. A SiN layer may be arranged as the base of the protective film 68 made of insulating resin.

Next, advantageous effects of the semiconductor device according to the first embodiment will be described in comparison with semiconductor devices according to comparative examples illustrated in FIGS. 22 to 25.

FIGS. 22 to 25 are plan views of semiconductor devices according to comparative examples. In the description of the comparative examples, descriptions of configurations that are common to the semiconductor device according to the first embodiment will be omitted.

Figure 22:
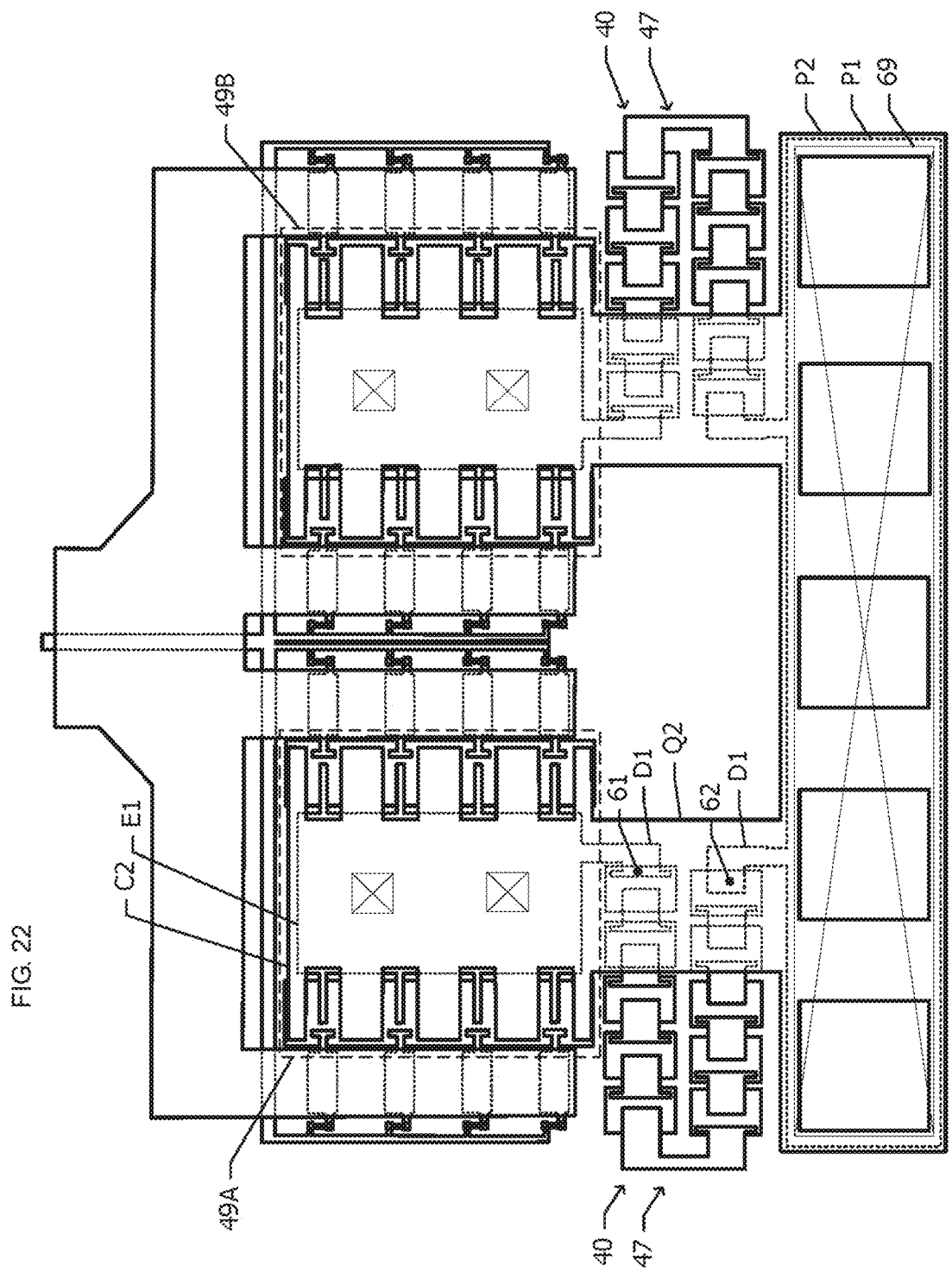
FIG. 22 is a plan view of a semiconductor device according to a comparative example.

In the comparative example illustrated in FIG. 22, a pad conductive layer P1 constituted of the wiring layer serving as the first layer is arranged under the pad conductive layer P2. The pad conductive layer P1 serving as the first layer and the pad conductive layer P2 serving as the second layer are connected to each other via a contact hole 69 provided in an interlayer insulating film disposed between the pad conductive layers P1 and P2. The pad conductive layer P1 serving as the first layer and the pad conductive layer P2 serving as the second layer have substantially the same planar shape, and the contact hole 69 has a planar shape slightly smaller than the pad conductive layers P1 and P2.

Because the pad conductive layer P1 serving as the first layer is arranged below the pad conductive layer P2 serving as the second layer, the protection circuit 40 including the diode wires D1 constituted of a conductive layer serving as the first layer cannot be arranged to overlap the pad conductive layer P2. Therefore, the protection circuit 40 is arranged between the first HBT cell block 49A and the pad conductive layer P2 and between the second HBT cell block 49B and the pad conductive layer P2. Like the case of the first embodiment, the protection circuit 40 is constituted of two diode series circuits 47, and each of the diode series circuits 47 has a planar shape folded back at the halfway point. The collector wire C2 and the pad conductive layer P2 are connected to each other with a connection wire Q2, which is constituted of the wiring layer serving as the second layer, interposed therebetween. The connection wire Q2 and the protection circuit 40 partially overlap each other.

The connection structure of the diode wire D1 connected to the cathode electrode 61 (FIGS. 4A and 4B) at the downstream end of the protection circuit 40 and the emitter wire E1 is the same as the connection structure (FIG. 2) of the semiconductor device according to the first embodiment. The diode wire D1 connected to the anode electrode 62 (FIGS. 4A and 4B) at the upstream end of the protection circuit 40 is continuous with the pad conductive layer P1 serving as the first layer.

Figure 23:
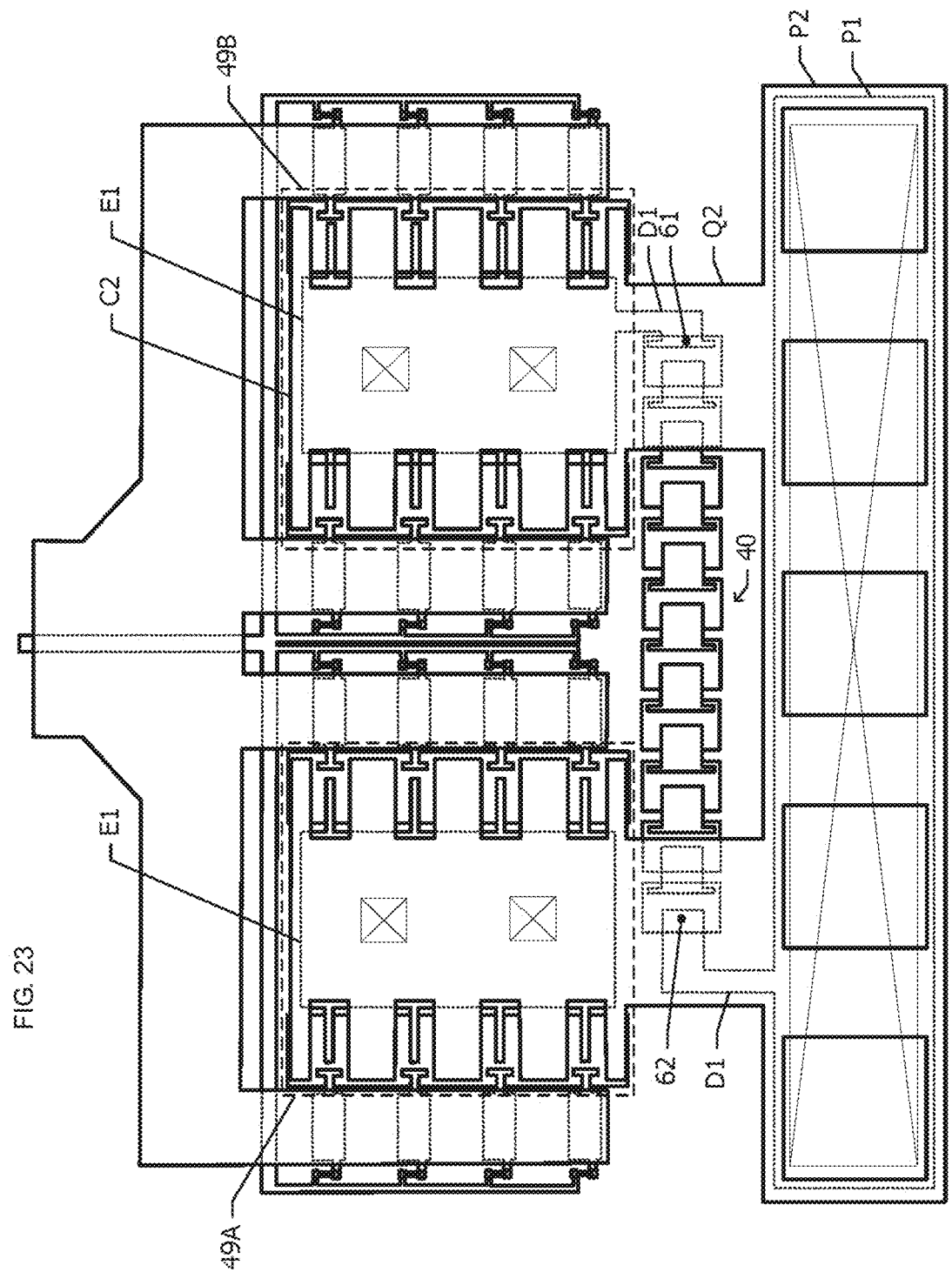
FIG. 23 is a plan view of a semiconductor device according to another comparative example.

In the comparative example illustrated in FIG. 23, the protection circuit 40 is constituted of one diode series circuit. The other configuration is the same as the configuration of the comparative example illustrated in FIG. 22. The diode series circuit extends along one straight line without being folded back. The direction in which the diode series circuit extends is parallel to the row direction of the HBTs 41 arranged in a matrix of four rows and four columns.

The diode wire D1 connected to the cathode electrode 61 at the downstream end of the protection circuit 40 is continuous with the emitter wire E1 of the second HBT cell block 49B. The protection circuit 40 is connected not directly to the emitter wire E1 of the first HBT cell block 49A, but is connected to the emitter wire E1 with the back-surface electrode 60 (FIGS. 3B, 4B, and 5) interposed therebetween. The diode wire D1 connected to the anode electrode 62 at the upstream end of the protection circuit 40 is continuous with the pad conductive layer P1 serving as the first layer.

In both of the comparative examples illustrated in FIGS. 22 and 23, the protection circuit 40 is arranged between the first HBT cell block 49A and the pad conductive layer P2 and between the second HBT cell block 49B and the pad conductive layer P2.

Figure 24:
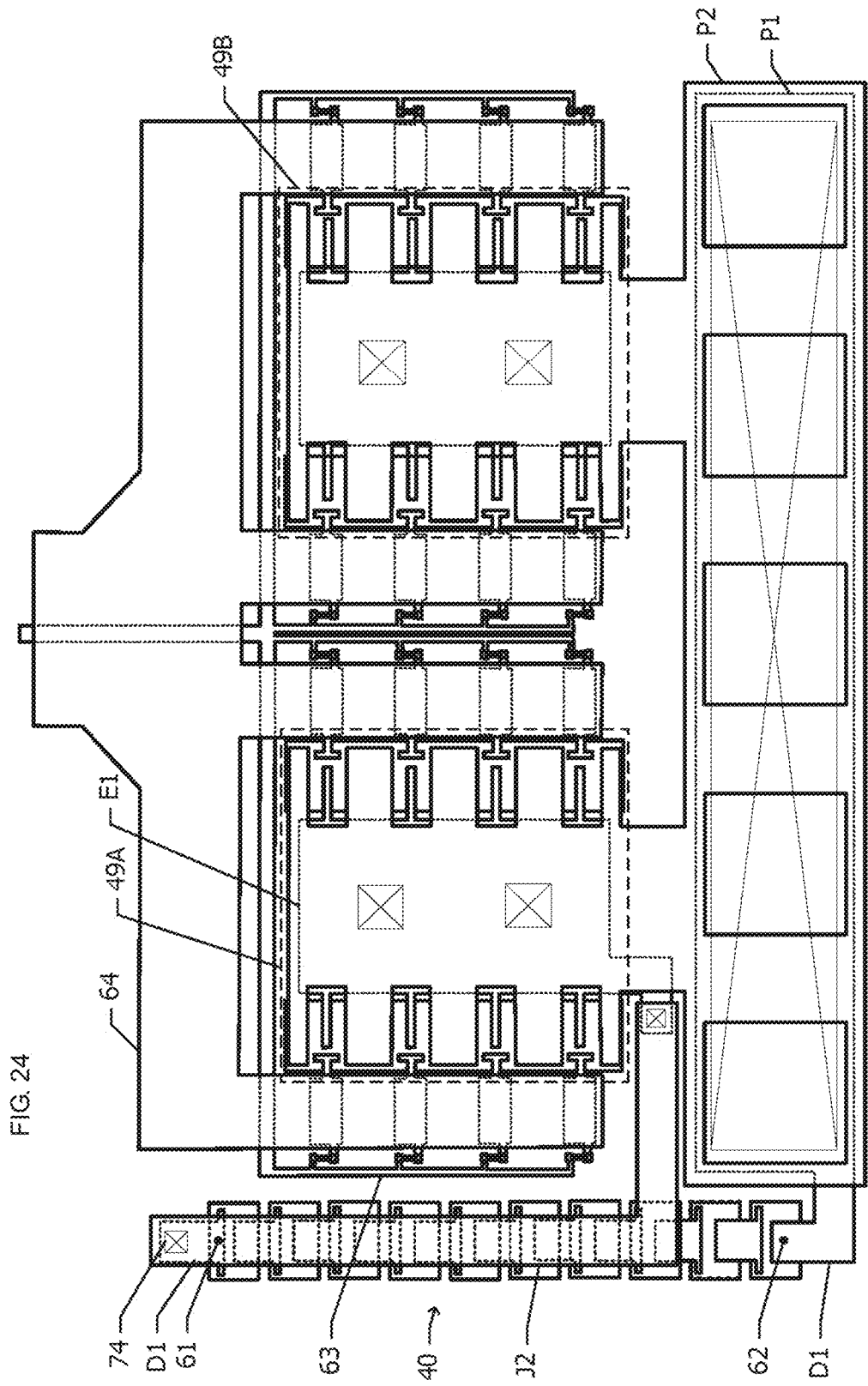
FIG. 24 is a plan view of a semiconductor device according to yet another comparative example.

In the comparative example illustrated in FIG. 24, the protection circuit 40 is arranged adjacent to the first HBT cell block 49A in the row direction (on the left in FIG. 24).

The diode wire D1 connected to the anode electrode 62 at the upstream end of the protection circuit 40 is continuous with the pad conductive layer P1 serving as the first layer. The protection circuit 40 extends in the column direction (upward in FIG. 24) from the connection point with the pad conductive layer P1, and reaches a position beyond the upper end of the first HBT cell block 49A. The diode wire D1 connected to the cathode electrode 61 at the downstream end of the protection circuit 40 is connected to a connection wire J2 on the second layer via a contact hole 74, and is connected to the emitter wire E1 of the first HBT cell block 49A with the connection wire J2 interposed therebetween. The emitter wire E1 of the second HBT cell block 49B is connected to the protection circuit 40 with the back-surface electrode 60 (FIGS. 3B, 4B, and 5) interposed therebetween.

The base control wire 63 on the first layer and the RF input wire 64 on the second layer are arranged between the protection circuit 40 and the emitter wire E1 of the first HBT cell block 49A. Therefore, the cathode electrode 61 at the downstream end of the protection circuit 40 and the emitter wire E1 cannot be connected to each other with a short wiring length using the wiring layer serving as the first layer or the second layer. In the comparative example illustrated in FIG. 24, the connection wire J2 extends from the position of the contact hole 74 along the diode array of the protection circuit 40 to an area between the first HBT cell block 49A and the pad conductive layer P2. Thereafter, the connection wire J2 is connected to the emitter wire E1 between the first HBT cell block 49A and the pad conductive layer P2. Because the emitter wire E1 and the protection circuit 40 are connected to each other with the long connection wire J2 interposed therebetween, the effects of parasitic inductance become greater.

Figure 25:
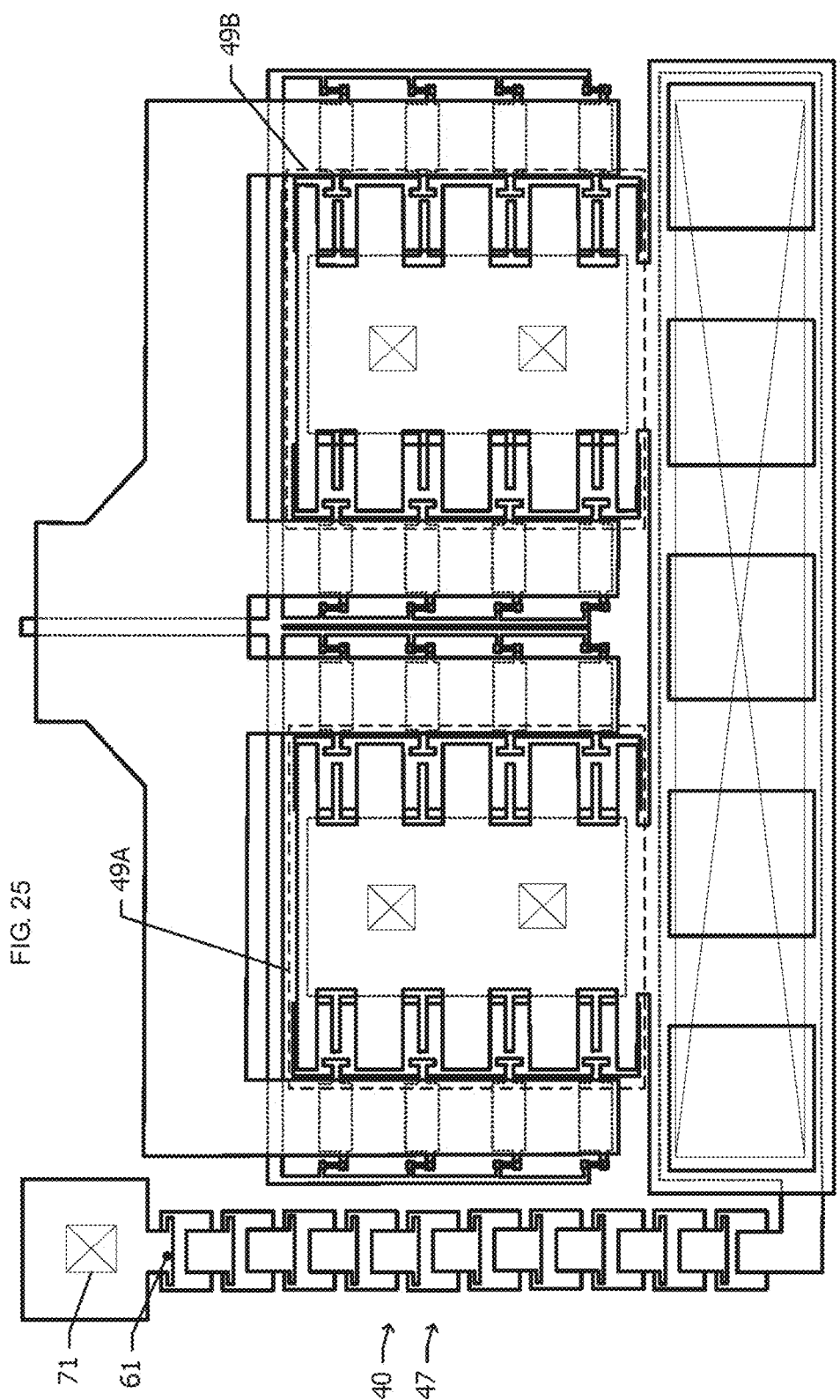
FIG. 25 is a plan view of a semiconductor device according to a further comparative example.

In the comparative example illustrated in FIG. 25, the cathode electrode 61 at the downstream end of the protection circuit 40 is grounded by being connected to the back-surface electrode 60 (FIGS. 3B, 4B, and 5) through a via hole 71.

Figure 3B:
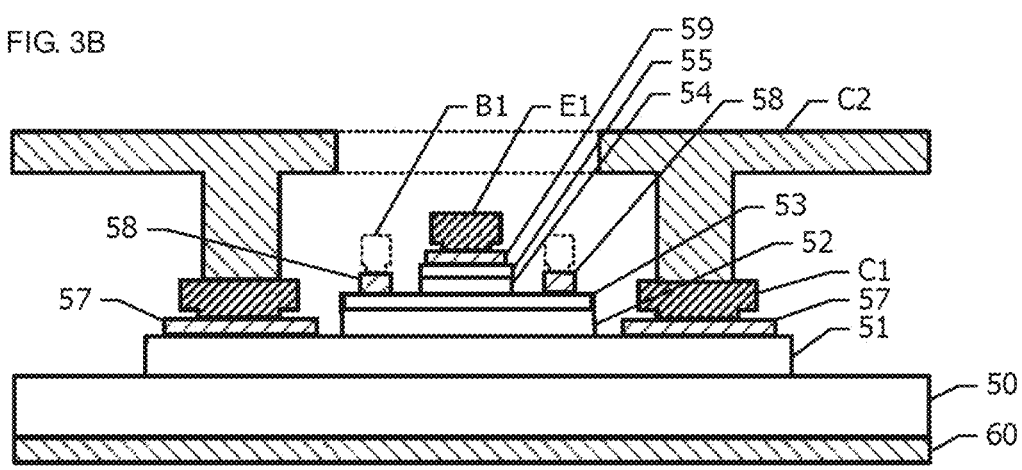
FIG. 3B is a sectional view taken along the dash-dotted line 3B-3B of FIG. 3A.
Figure 4B:
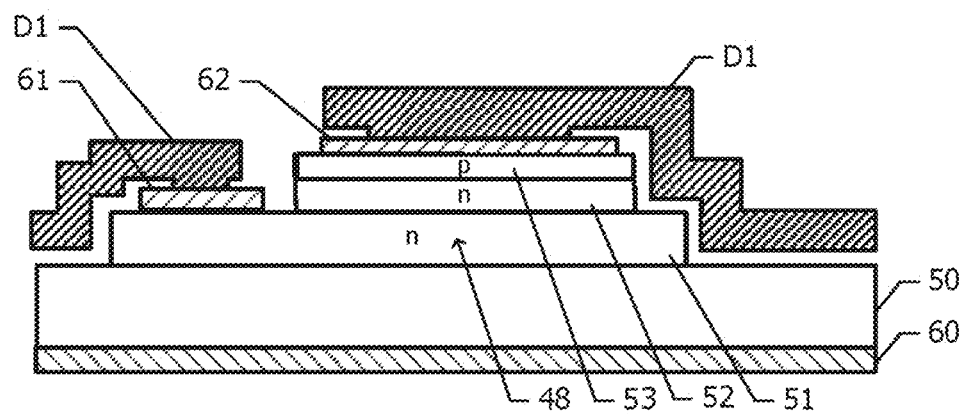
FIG. 4B is a sectional view taken along the dash-dotted line 4B-4B of FIG. 4A.

In any of the comparative examples illustrated in FIGS. 22 to 25, the pad conductive layer P2 and the protection circuit 40 do not overlap each other, and each of the pad conductive layer P2 and the protection circuit 40 occupies the surface of the substrate 50 (FIGS. 3B, 4B, and 5). In contrast, in the first embodiment (FIG. 2), the pad conductive layer P2 and the protection circuit 40 are arranged to at least partially overlap each other. Therefore, the chip area can be reduced, compared to these comparative examples.

In the comparative examples illustrated in FIGS. 22 and 23, the protection circuit 40 is arranged between the first HBT cell block 49A and the pad conductive layer P2 and between the second HBT cell block 49B and the pad conductive layer P2. Therefore, the connection wire Q2 connecting the pad conductive layer P2 and the collector wire C2 becomes longer. A parasitic resistance caused by the connection wire Q2 is inserted in series with the collector circuit of the HBT 41 (FIG. 1B). Because the pad conductive layer P2 is arranged adjacent to the first HBT cell block 49A and the second HBT cell block 49B in the first embodiment (FIG. 2), the wire connecting the pad conductive layer P2 and the collector wire C2 can be made shorter. Therefore, it is possible to suppress performance deterioration of the amplifier circuit due to an increase in parasitic resistance inserted into the collector circuit of the HBT 41 (FIG. 1B).

In the comparative example illustrated in FIG. 24, a parasitic inductance caused by the connection wire J2 is inserted in series with the protection circuit 40. Because an increase in parasitic inductance deteriorates the responsiveness particularly at high frequencies, the protection function becomes deteriorated. In the first embodiment, a long wire that has a great parasitic inductance is not used for connecting the protection circuit 40. Therefore, it is possible to suppress deterioration of the protection function of the protection circuit 40.

In the comparative example illustrated in FIG. 25, it is necessary to newly secure an area for arranging the via hole 71 for connecting the protection circuit 40 and the back-surface electrode 60 (FIGS. 3B, 4B, and 5). Therefore, the chip size is increased, compared to the comparative example in FIG. 24. Because it is not necessary to provide such a via hole 71 in the first embodiment, an increase in chip size can be avoided.

In the first embodiment, one of two diode series circuits 47 is connected to the emitter wire E1 of the first HBT cell block 49A, and the other diode series circuit 47 is connected to the emitter wire E1 of the second HBT cell block 49B. Therefore, the protection circuit 40 is arranged in a well-balanced manner for the first HBT cell block 49A and the second HBT cell block 49B.

By folding back each of the two diode series circuits 47 at the halfway point, protrusions of the diode series circuits 47 from the pad conductive layer P2 can be eliminated or reduced in area. Therefore, arrangement of the two diode series circuits 47 does not prevent reduction of the chip size.

Next, referring to FIGS. 26A and 26B, the effects of using the protection diodes 48 (FIG. 2) having a planar shape illustrated in FIG. 4A will be described.

Figure 26A:
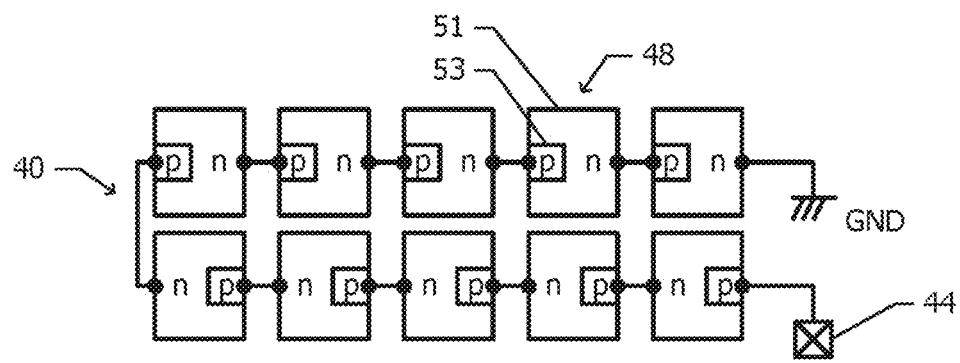
FIG. 26A is a planar schematic diagram of the protection circuit used in the semiconductor circuit according to the first embodiment.

FIG. 26A is a planar schematic diagram of the protection circuit 40. Ten protection diodes 48 are connected in series. Each of the protection diodes 48 includes the n-type sub-collector layer 51 (FIGS. 4A and 4B), and the p-type base layer 53, which is arranged inside the sub-collector layer 51 in plan view. FIG. 26A illustrates the conductivity type of the uppermost surface of stacked semiconductor layers. When attention is paid to the uppermost surface of the semiconductor layer, the n-type area of the sub-collector layer 51 surrounds the p-type area of the base layer 53 from three directions. It thus means that the n-type areas are arranged on both sides of the p-type area in the width direction of the diode array. The base layer 53 of the protection diode 48 positioned at the upstream end of forward-direction current flowing through the diode array is connected to the collector terminal 44, and the sub-collector layer 51 of the protection diode 48 positioned at the downstream end is connected to ground GND (FIG. 1B).

Figure 26B:
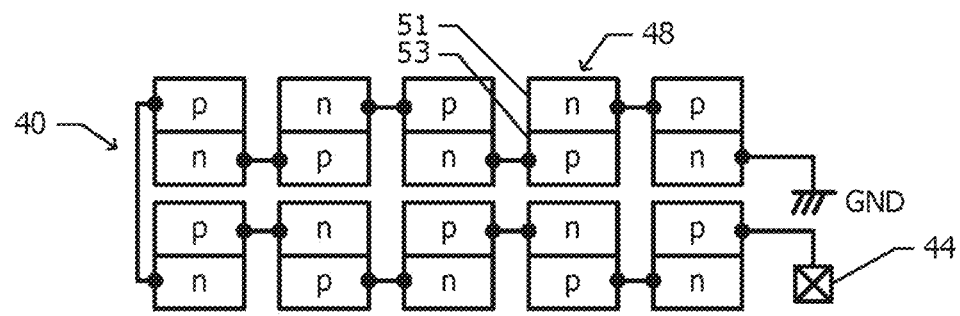
FIG. 26B is a planar schematic diagram of a protection circuit used in a semiconductor circuit according to a comparative example.

FIG. 26B is a planar schematic diagram of a protection circuit according to a comparative example. In the comparative example, the p-type base layer 53 is arranged to be biased on one side in the width direction of the diode array. The diode array is folded back in the middle, and two protection diodes 48 are close to each other in the width direction. In the comparative example illustrated in FIG. 26B, the p-type area of the protection diode 48 positioned at the upstream end and the n-type area of the protection diode 48 positioned at the downstream end face each other and are close to each other. With such an arrangement, it is known that, in response to application of a high voltage from the outside to the collector terminal 44, electrostatic discharge tends to occur between the protection diode 48 at the upstream end and the protection diode 48 at the downstream end (see WO 2016/047217). When electrostatic discharge occurs, the protection diodes 48 are destroyed.

In the first embodiment, there is the n-type area of the protection diode 48 at the upstream end between the p-type area of the protection diode 48 at the upstream end and the n-type area of the protection diode 48 at the downstream end. As described here, the p-type area of the protection diode 48 positioned at the upstream end and the n-type area of the protection diode 48 positioned at the downstream end do not face each other. Therefore, electrostatic discharge becomes less likely to occur in response to application of a high voltage, and the destruction of the protection diodes 48 can be suppressed.

Although the configuration in the first embodiment is such that the substantially U-shaped cathode electrode 61 of the protection diode 48 surrounds the p-type area from three directions, the configuration may conversely be such that the anode electrode 62 is substantially U-shaped and surrounds the n-type area from three directions.

Other effects include that, because the semiconductor device according to the first embodiment is made of compound semiconductor, the operating frequency can be made higher, compared to semiconductor devices made of silicon.

Second Embodiment

Next, referring to FIGS. 6 and 7, a semiconductor device according to a second embodiment will be described. Hereinafter, descriptions of configurations that are common to the semiconductor device according to the first embodiment will be omitted.

Figure 6:
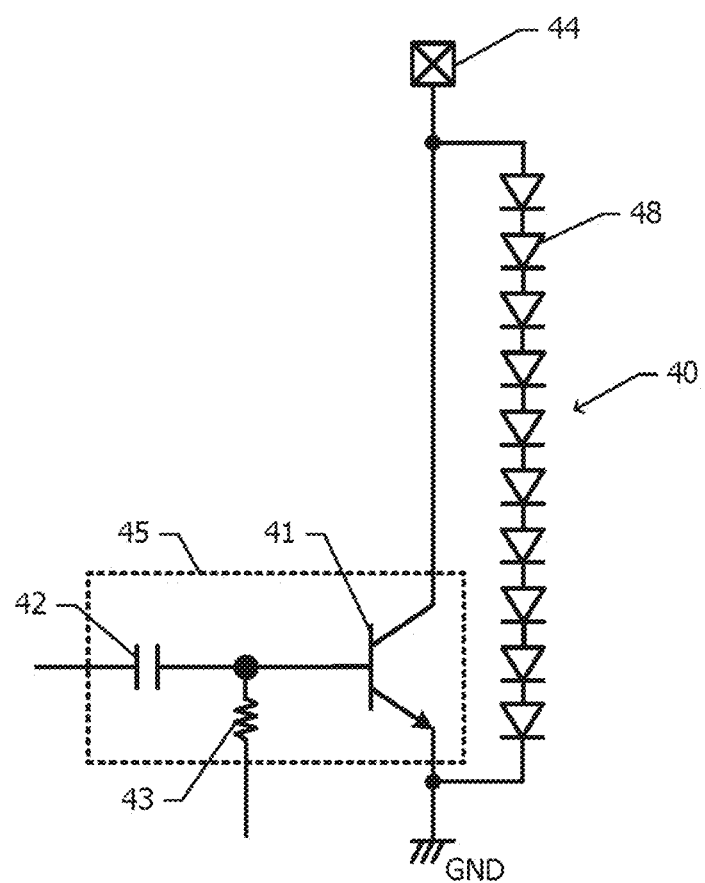
FIG. 6 is an equivalent circuit diagram of an output-stage amplifier circuit and a protection circuit of a semiconductor device according to a second embodiment.

FIG. 6 is an equivalent circuit diagram of the output-stage amplifier circuit 32 (FIG. 1A) and the protection circuit 40 of the semiconductor device according to the second embodiment. Although the protection circuit 40 is constituted of two diode series circuits 47 in the first embodiment, the protection circuit 40 is constituted of one diode series circuit in the second embodiment.

Figure 7:
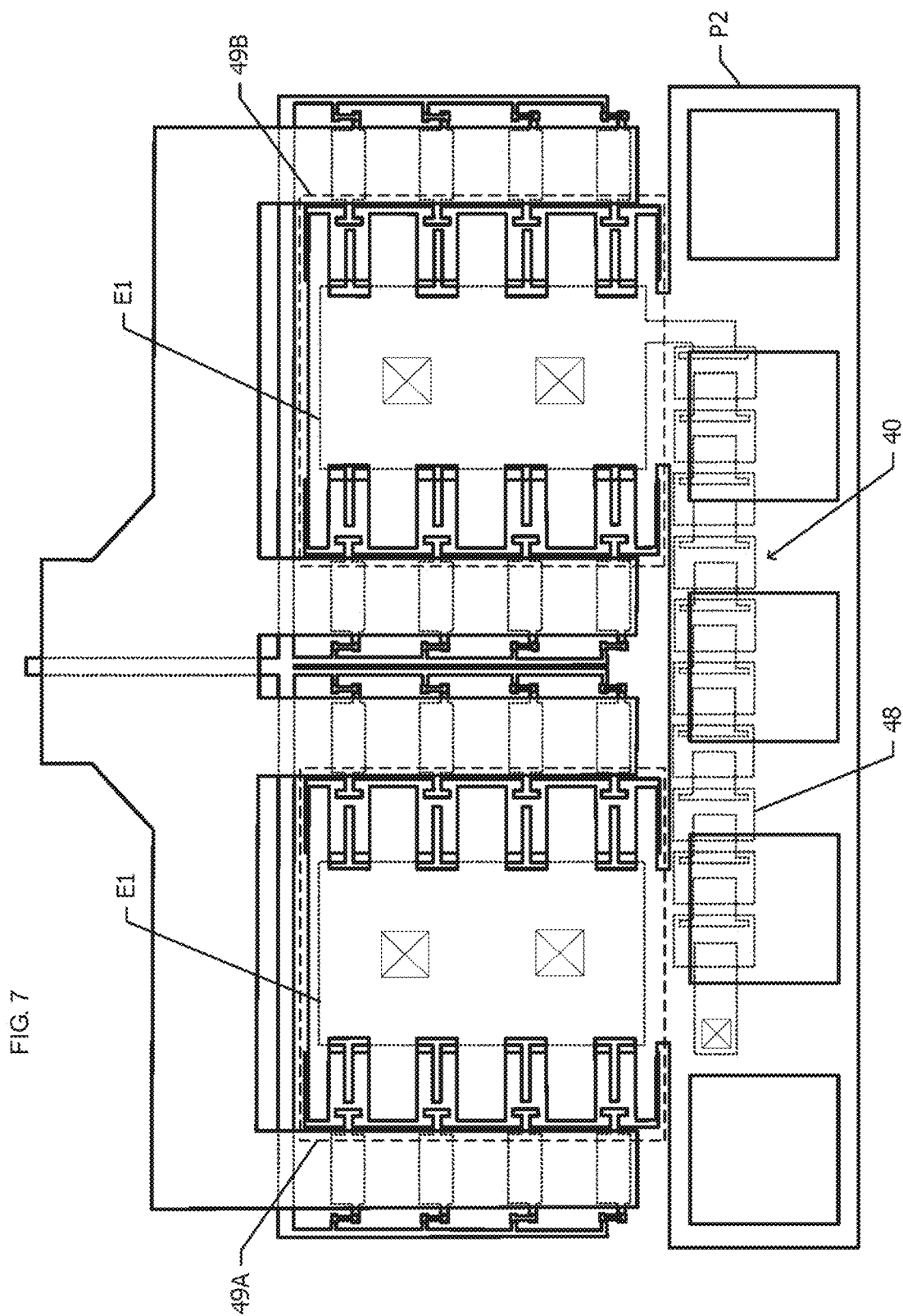
FIG. 7 is a plan view of the semiconductor device according to the second embodiment.

FIG. 7 is a plan view of the semiconductor device according to the second embodiment. In the first embodiment, as illustrated in FIG. 2, the two diode series circuits 47 are connected to the emitter wire E1 of the first HBT cell block 49A and to the emitter wire E1 of the second HBT cell block 49B. In contrast, in the second embodiment, the protection circuit 40 is connected only to the emitter wire E1 of the second HBT cell block 49B, and the protection circuit 40 is connected not directly to the emitter wire E1 of the first HBT cell block 49A. The emitter wire E1 of the first HBT cell block 49A is connected to the protection circuit 40 with the back-surface electrode 60 (FIGS. 3B, 4B, and 5) and the emitter wire E1 of the second HBT cell block 49B interposed therebetween.

In the second embodiment, a plurality of protection diodes 48 constituting the protection circuit 40 are arrayed along one straight line. The array direction is parallel to a direction from the second HBT cell block 49B to the first HBT cell block 49A.

Also in the second embodiment, the protection circuit 40 and the pad conductive layer P2 overlap each other, and the POE structure is adopted. Therefore, advantageous effects that are the same as or similar to those of the first embodiment are achieved also in the second embodiment.

In the second embodiment, because the protection circuit 40 is directly connected only to the emitter wire E1 of the second HBT cell block 49B, protection effects are not equal for the HBTs 41 of the first HBT cell block 49A and the HBTs 41 of the second HBT cell block 49B. In order to equally protect the HBTs 41 of the first HBT cell block 49A and the HBTs 41 of the second HBT cell block 49B, it is preferable to adopt the configuration of the first embodiment rather than the configuration of the second embodiment.

Note that the number of protection diodes 48 constituting the protection circuit 40 of the first embodiment is twice the number of protection diodes 48 constituting the protection circuit 40 of the second embodiment. Therefore, it may be difficult to accommodate the entire area of the protection circuit 40 inside the pad conductive layer P2 (FIG. 2). In the second embodiment, the entire area of the protection circuit 40 is easily accommodated inside the pad conductive layer P2. As described here, the second embodiment is more advantageous than the first embodiment from the viewpoint of reducing the chip size.

Third Embodiment

Next, referring to FIG. 8, a semiconductor device according to a third embodiment will be described. Hereinafter, descriptions of configurations that are common to the semiconductor device according to the second embodiment will be omitted.

Figure 8:
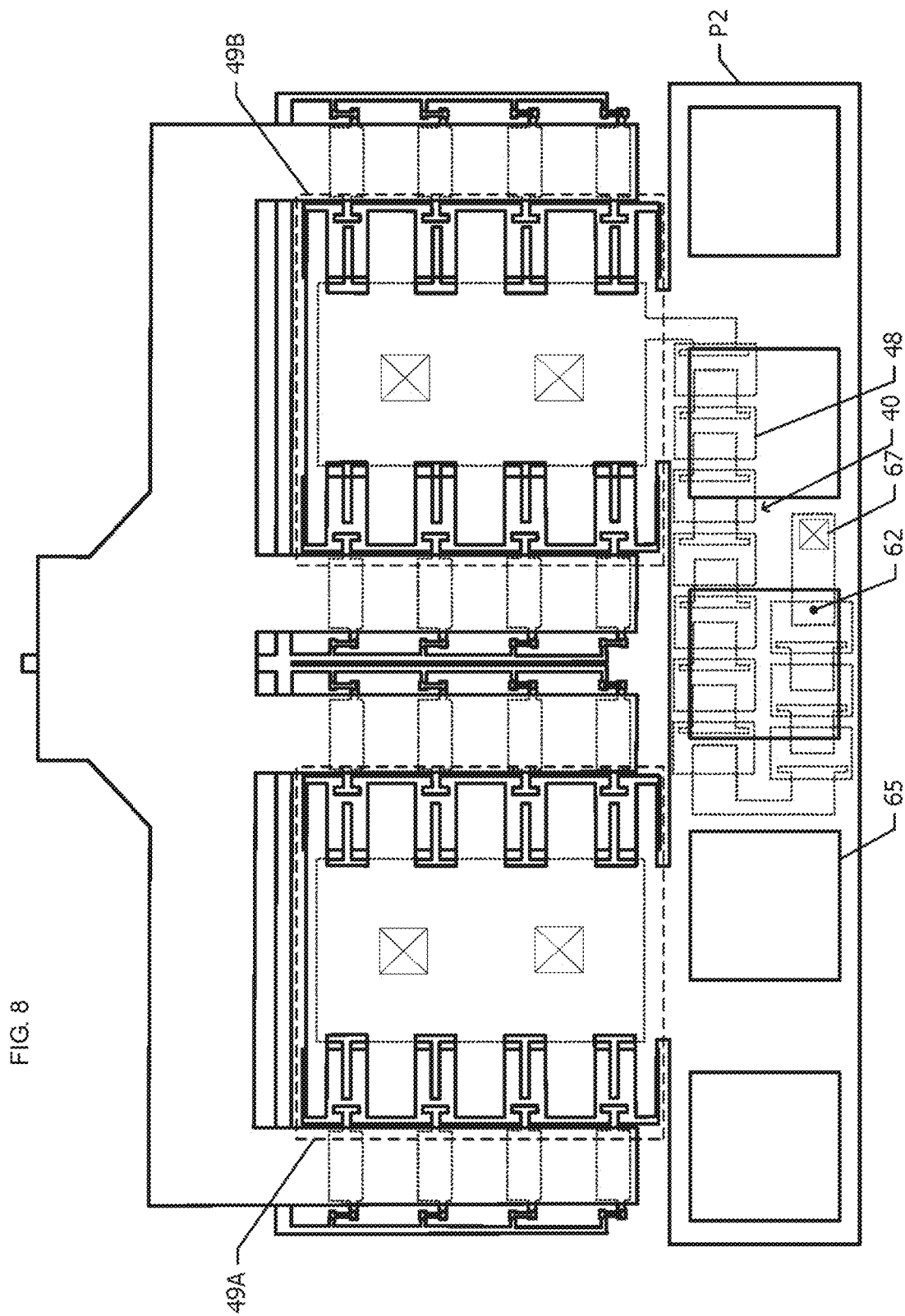
FIG. 8 is a plan view of a semiconductor device according to a third embodiment.

FIG. 8 is a plan view of the semiconductor device according to the third embodiment. In the second embodiment, a plurality of protection diodes 48 constituting the protection circuit 40 (FIG. 7) are arrayed along one straight line. In the third embodiment, a diode array constituted of a plurality of protection diodes 48 constituting the protection circuit 40 is folded back in the middle. The folding point need not necessarily be the halfway point of the diode array.

Also in the third embodiment, the protection circuit 40 overlaps the pad conductive layer P2. Therefore, advantageous effects that are the same as or similar to those of the second embodiment are also achieved. Because the diode array can be folded back at an arbitrary point, the degree of freedom of the position of the contact hole 67 for connecting the anode electrode 62 at the upstream end of the protection circuit 40 to the pad conductive layer P2 becomes higher.

Because the opening portion of each pad 65 becomes a moisture intrusion route, it is preferable to keep the contact hole 67 away from each pad 65. In the third embodiment, because the degree of freedom of the position of the contact hole 67 becomes higher, it becomes easier to keep the contact hole 67 away from each pad 65.

When an insulating resin film is used as an inter-layer insulating film for flattening the surface of the base of the pad conductive layer P2, the flatness of the upper surface of the pad conductive layer P2 is deteriorated at a place where the contact hole 67 is arranged. To secure the flatness of the surface of the pad conductive layer P2 inside each pad 65, it is preferable to arrange the contact hole 67 so as not to overlap each pad 65. Because the degree of freedom of the position of the contact hole 67 becomes higher in the third embodiment, it becomes easier to arrange the contact hole 67 so as not to overlap each pad 65.

Modifications of First, Second, and Third Embodiments

Next, modifications of the first, second, and third embodiments will be described.

Figure 9:
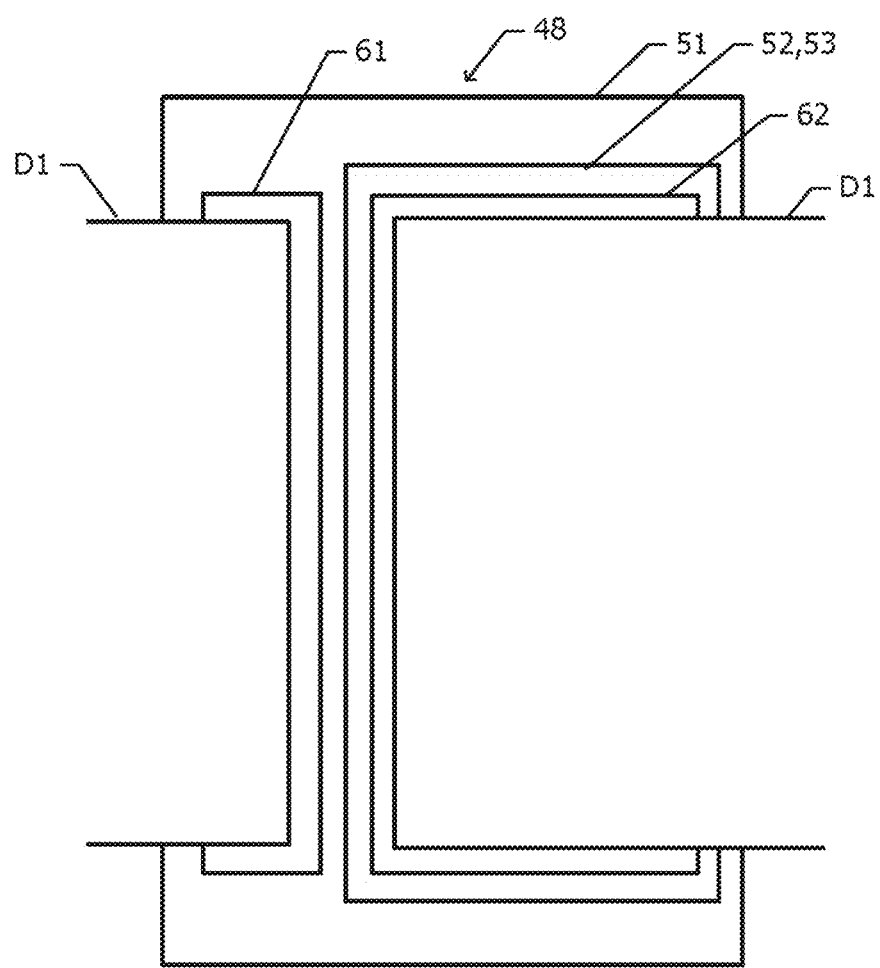
FIG. 9 is a plan view of a protection diode included in a protection circuit of a semiconductor device according to a modification.

FIG. 9 is a plan view of the protection diode 48 included in the protection circuit 40 according to a modification. The following description will be given in comparison with the plan view of the protection diode 48 illustrated in FIG. 4A. In the protection diode 48 illustrated in FIG. 4A, the cathode electrode 61 surrounds the base layer 53 from three directions. In contrast, in the modification illustrated in FIG. 9, the cathode electrode 61 is arranged to be adjacent to the base layer 53 in a direction in which the diode array extends.

The anode electrode 62 is formed on the upper surface of the base layer 53. The diode wire D1 connected to the anode electrode 62 and the diode wire D1 connected to the cathode electrode 61 extend in mutually opposite directions.

In the modification illustrated in FIG. 9, the width of each diode wire D1 can be made wider, compared to the embodiment illustrated in FIG. 4A. Therefore, it becomes possible to suppress an increase in parasitic inductance caused by the diode wires D1.

In the modification illustrated in FIG. 9, like the comparative example illustrated in FIG. 26B, the arrangement may be such that the p-type area of the protection diode 48 positioned at the upstream end of forward-direction current and the n-type area of the protection diode 48 positioned at the downstream end face each other. In the case of adopting the arrangement where the diode array is folded back, it is necessary to pay attention to the arrangement of the protection diodes 48 in order to suppress the destruction of the protection diodes 48 in response to application of a high voltage.

Figure 10:
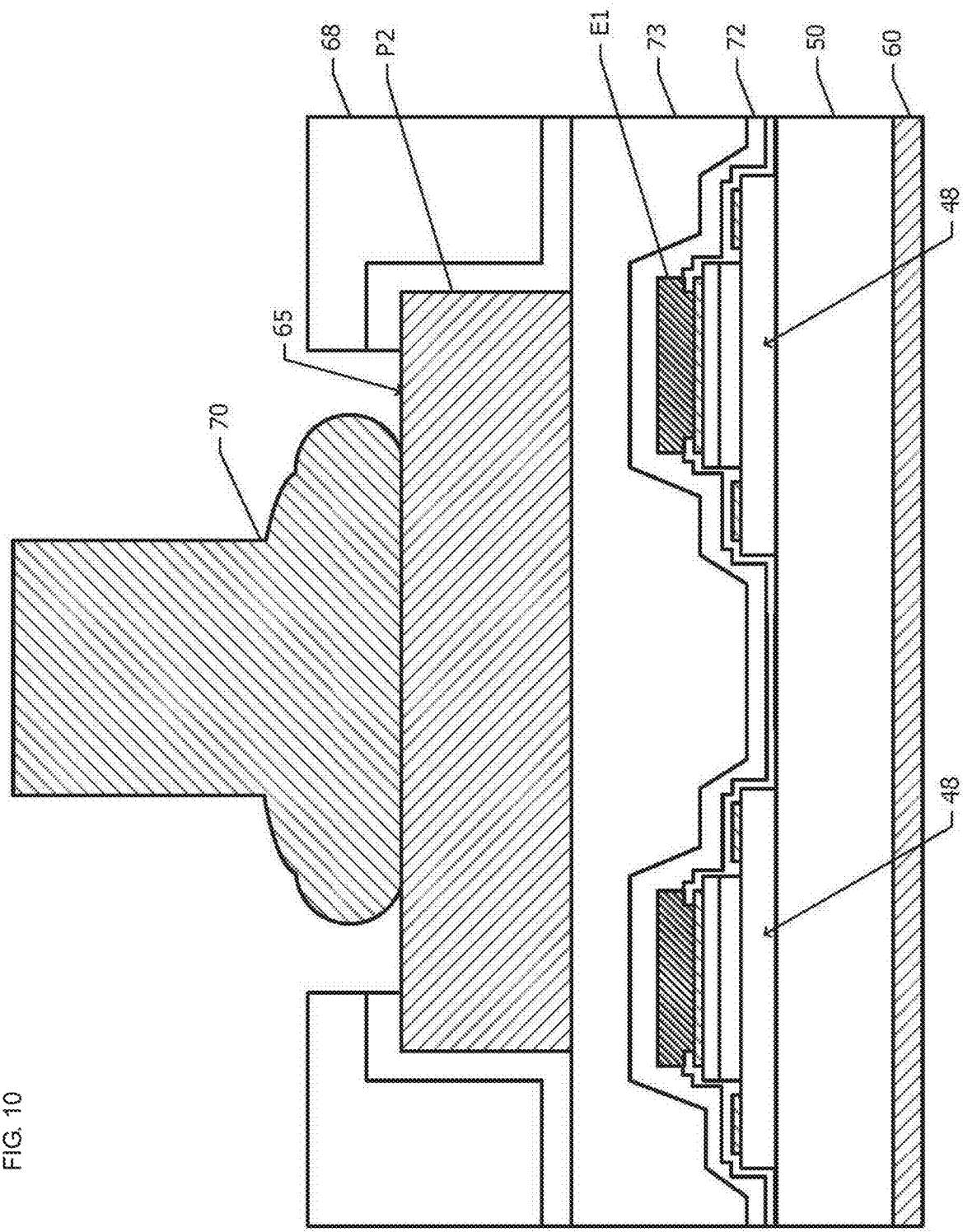
FIG. 10 is a sectional view of a pad portion of the semiconductor device according to the modification.

FIG. 10 is a sectional view of a pad portion of a semiconductor device according to a modification. The following description will be given in comparison with the sectional view of the pad portion illustrated in FIG. 5. In the first embodiment illustrated in FIG. 5, an inorganic insulating film such as SiN is used for an inter-layer insulating film between the wiring layer serving as the first layer, which includes the emitter wire E1 and so forth, and the wiring layer serving as the second layer, which includes the pad conductive layer P2 and so forth. In the modification illustrated in FIG. 10, an inter-layer insulating film between the wiring layer serving as the first layer and the wiring layer serving as the second layer has a two-layer structure including an inorganic insulating film 72 and an insulating resin film 73. For example, polyimide may be used for the insulating resin film 73.

In the modification illustrated in FIG. 10, the upper surface of the insulating resin film 73, that is, the surface of the base of the pad conductive layer P2, can be made flat. Furthermore, because impact at the time of bonding the bonding wire 70 to the pad 65 is less likely to be transmitted to a semiconductor element directly therebelow, the destruction of the element due to impact at the time of bonding can be suppressed.

Fourth Embodiment

Next, referring to FIGS. 11 to 13, a semiconductor device according to a fourth embodiment will be described. Hereinafter, descriptions of configurations that are common to the semiconductor device according to the first embodiment will be omitted. Although the semiconductor device according to the first embodiment is for face-up mounting, the semiconductor device according to the fourth embodiment is for face-down mounting.

Figure 11:
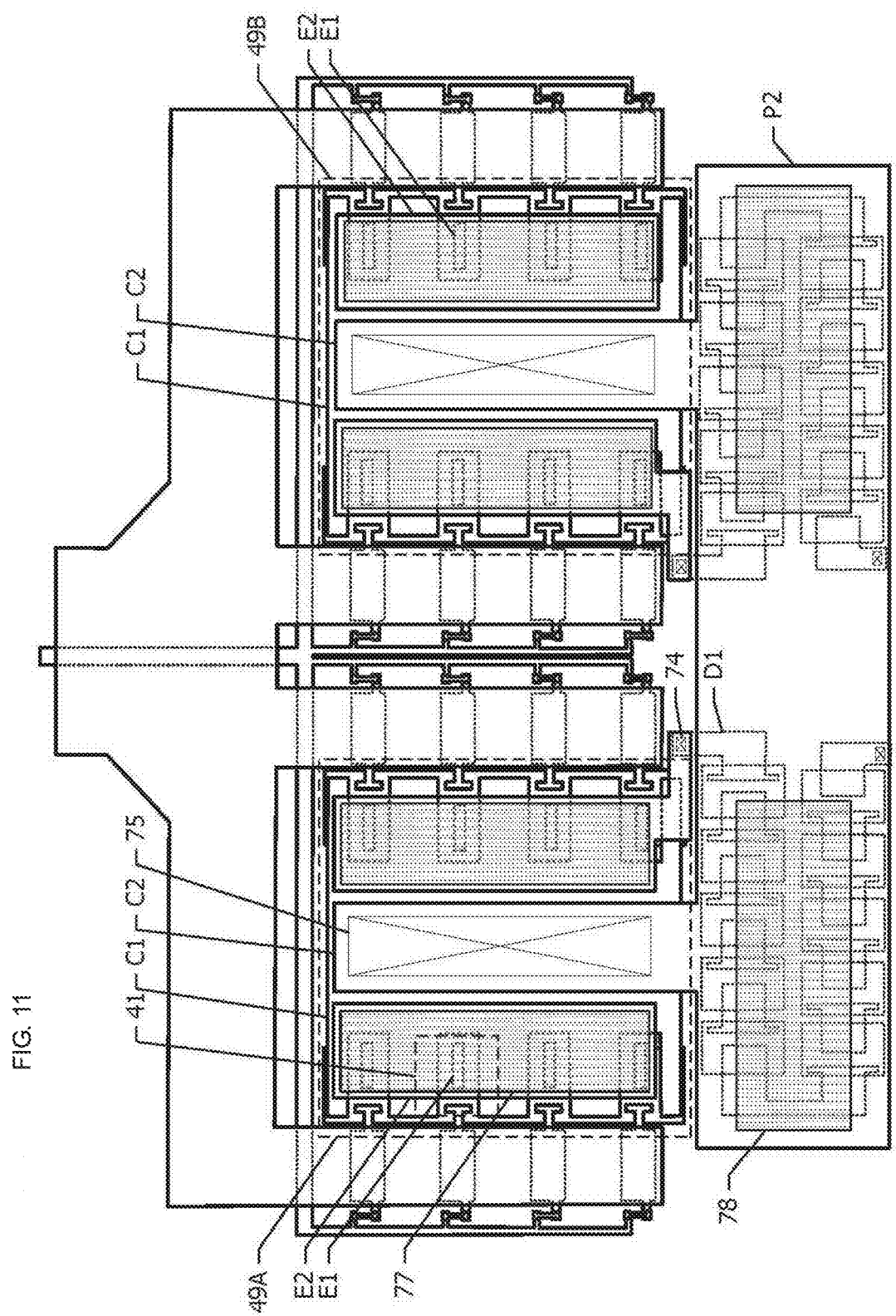
FIG. 11 is a plan view of a semiconductor device according to a fourth embodiment.

FIG. 11 is a plan view of the semiconductor device according to the fourth embodiment. The emitter wire E1 on the first layer is arranged for each of the emitter electrodes 59 (FIG. 3B) of the plurality of HBTs 41. The emitter wire E2 on the second layer is arranged for each column of the HBTs 41 arranged in a matrix of four rows and four columns. The emitter wire E2 is connected to the emitter electrode 59 of each HBT 41 with the emitter wire E1, which is immediately therebelow, interposed therebetween.

One collector wire C1 on the first layer is arranged for eight HBTs 41 of the first HBT cell block 49A. The collector wire C2 on the second layer is arranged between the emitter wire E2 corresponding to the first column and the emitter wire E2 corresponding to the second column. The collector wire C2 is connected to the collector wire C1, which is immediately therebelow, via a contact hole 75. The collector wire C2 is continuous with the pad conductive layer P2. The emitter wire E2 corresponding to the second column is extracted to an area not overlapping the collector wire C1 on the first layer, and is connected to the diode wire D1 on the first layer through the contact hole 74.

The configuration of the emitter wires E1 and E2 and the collector wires C1 and C2 corresponding to the second HBT cell block 49B is the same as the configuration of the emitter wires E1 and E2 and the collector wires C1 and C2 corresponding to the first HBT cell block 49A.

Bumps 77 for grounding are arranged on the emitter wire E2, and bumps 78 for RF output are arranged on the pad conductive layer P2. Although FIG. 11 illustrates an example where two bumps 78 are arranged on the pad conductive layer P2, the number of bumps 78 is not limited to two. The number of bumps 78 may be one, or three or more.

Figure 12:
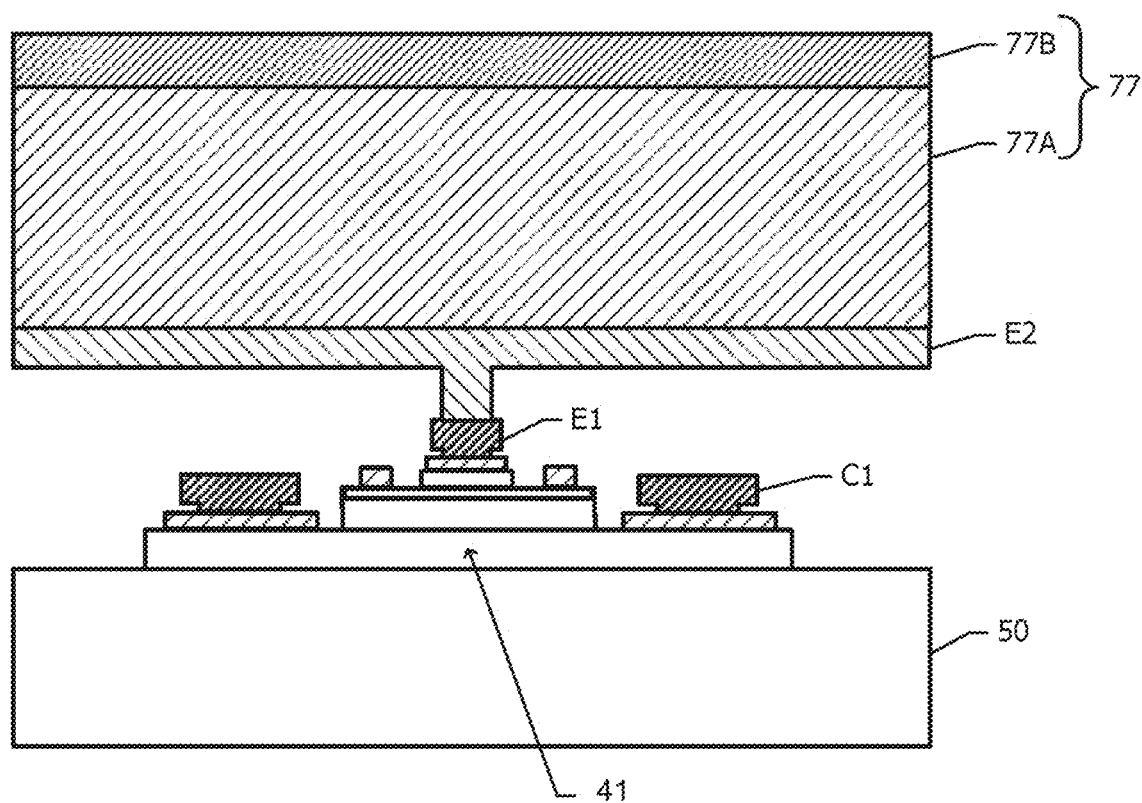
FIG. 12 is a schematic sectional view of a portion corresponding to one HBT of the semiconductor device according to the fourth embodiment.

FIG. 12 is a schematic cross-sectional view of a portion corresponding to one HBT 41. Whereas the collector wire C2 on the second layer is arranged just above the collector wires C1 (FIG. 3B) on the first layer in the first embodiment, the collector wire C2 on the second layer is not arranged just above the collector wires C1 on the first layer in the fourth embodiment. Instead, the emitter wire E2 on the second layer is arranged just above the emitter wire E1 on the first layer.

The bump 77 for grounding is arranged on the emitter wire E2. The bump 77 has a multilayer structure where, for example, an Au layer 77A and a solder layer 77B are stacked.

Figure 13:
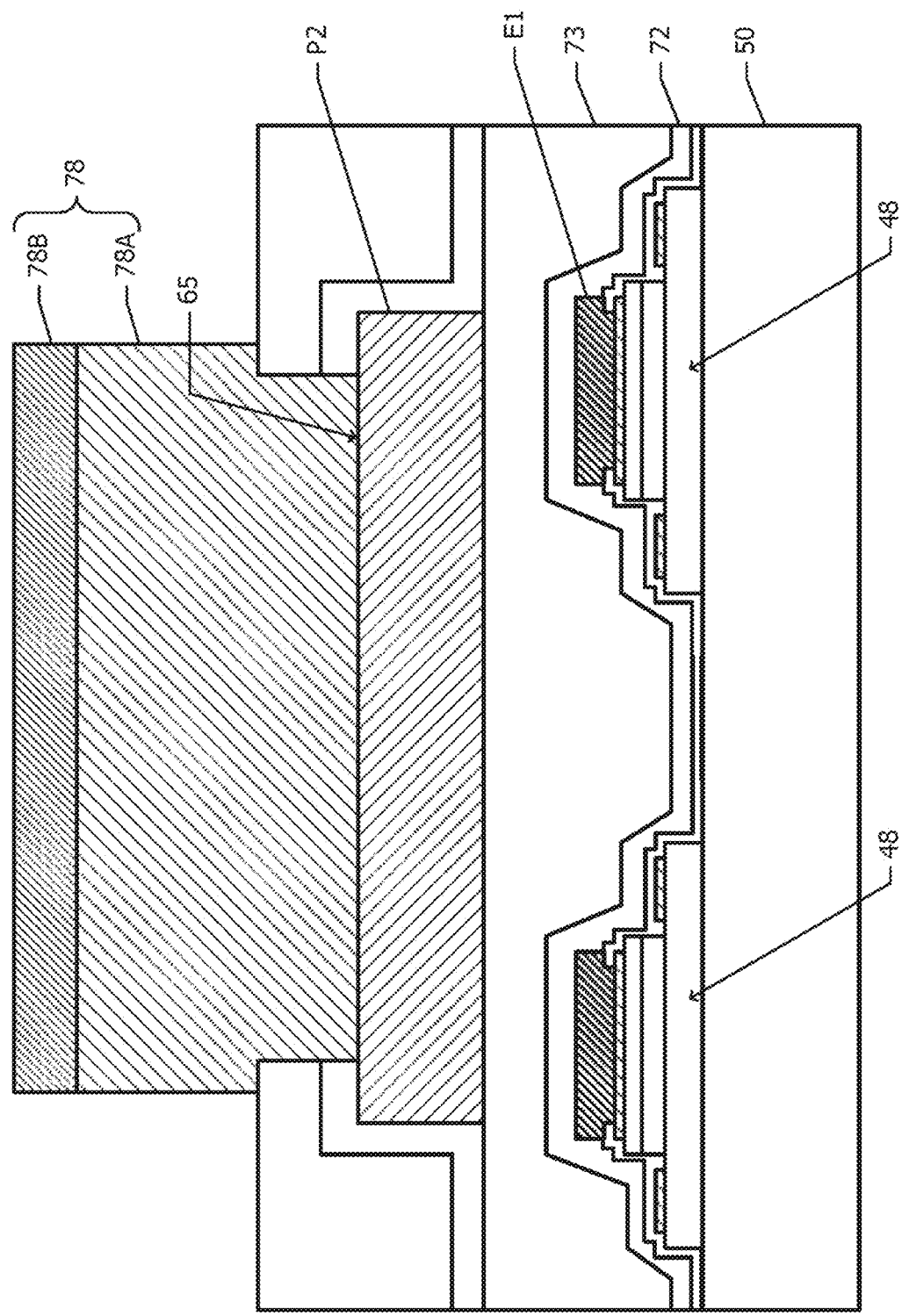
FIG. 13 is a sectional view of a portion where a bump for RF output of the semiconductor device according to the fourth embodiment is formed.

FIG. 13 is a cross-sectional view of a portion where the bump 78 for RF output is formed. The protection diodes 48 constituting the protection circuit 40 (FIG. 1B) are covered with an inter-layer insulating film constituted of the inorganic insulating film 72 and the insulating resin film 73. The pad 65, which is constituted of part of the pad conductive layer P2, is arranged above the protection diodes 48. The bump 78 for RF output is arranged on the pad 65. The bump 78 has a two-layer structure where an Au layer 78A and a solder layer 78B are stacked.

Next, advantageous effects of the fourth embodiment will be described. Also in the fourth embodiment, the POE structure where the protection circuit 40 and the pad conductive layer P2 overlap each other, as illustrated in FIG. 9, is adopted. Therefore, advantageous effects that are the same as or similar to those of the first embodiment are also achieved. For example, the chip size can be reduced. Because it is possible to suppress an increase in parasitic inductance inserted in series with the protection circuit 40, deterioration of the protection function at high frequencies can be suppressed. Furthermore, because it is possible to suppress an increase in parasitic resistance inserted in series with the collector circuit of each HBT 41, performance deterioration of the output-stage amplifier circuit can be suppressed.

Modifications of Fourth Embodiment

Next, referring to FIGS. 14 to 16, semiconductor devices according to various modifications of the fourth embodiment will be described.

Figure 14:
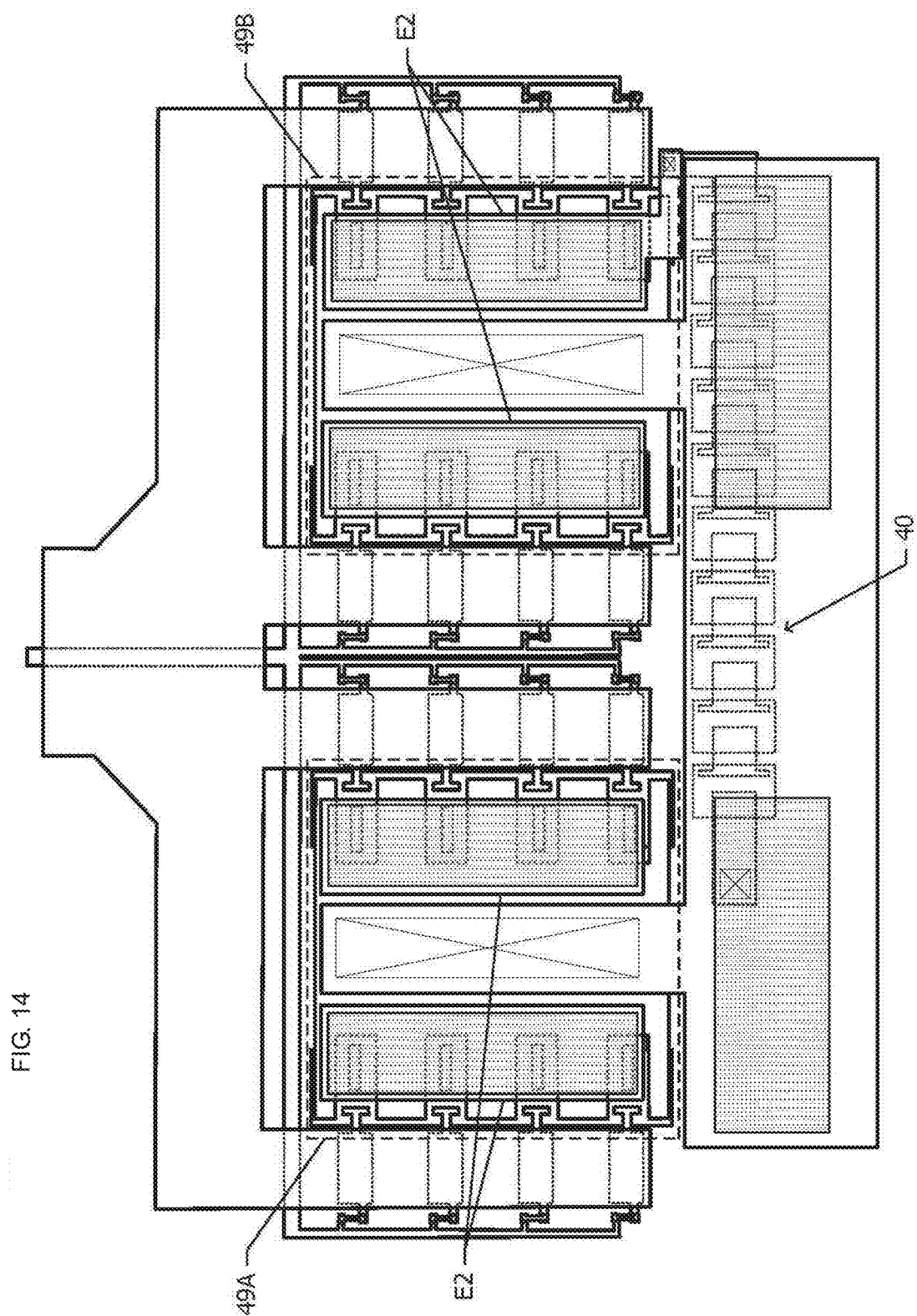
FIG. 14 is a plan view of a semiconductor device according to a first modification of the fourth embodiment.

FIG. 14 is a plan view of a semiconductor device according to a first modification of the fourth embodiment. In the fourth embodiment, as illustrated in FIG. 9, the protection circuit 40 is arranged for each of the first HBT cell block 49A and the second HBT cell block 49B. In contrast, in the modification of the fourth embodiment, which is illustrated in FIG. 14, the protection circuit 40 is arranged only for the second HBT cell block 49B, and no protection circuit 40 is arranged for the first HBT cell block 49A.

The emitter wire E2 of the first HBT cell block 49A is connected to the protection circuit 40 via a ground conductor inside the module substrate and the emitter wire E2 of the second HBT cell block 49B in a state where the semiconductor device is face-down mounted on the module substrate. In the modification of the fourth embodiment, the diode array of the protection circuit 40 is arrayed along one straight line. Note that the diode array of the protection circuit 40 may be shaped so as to be folded back, like the protection circuit 40 of the third embodiment (FIG. 8).

Figure 15:
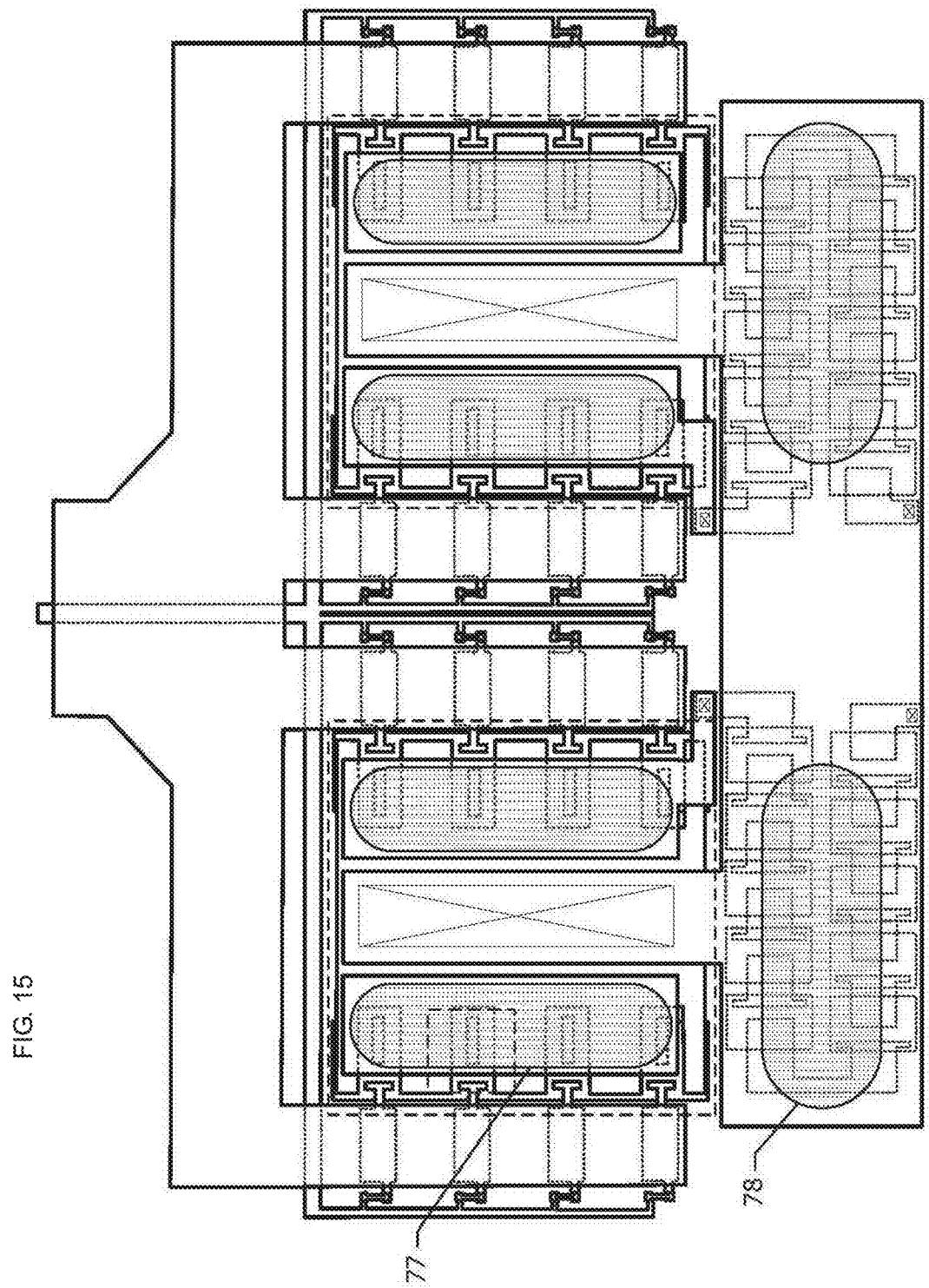
FIG. 15 is a plan view of a semiconductor device according to a second modification of the fourth embodiment.

FIG. 15 is a plan view of a semiconductor device according to a second modification of the fourth embodiment. In the fourth embodiment, as illustrated in FIG. 11, the planar shape of the bumps 77 for grounding and the bumps 78 for RF output is substantially rectangular. In contrast, in the second modification, as illustrated in FIG. 15, the planar shape of the bumps 77 and the bumps 78 is substantially rectangular with four rounded corners. For example, the planar shape of the bumps 77 and the bumps 78 has two parallel lines of substantially equal length and a substantially racetrack-shaped outer circumferential line constituted of two semicircles connecting the two parallel lines.

In the fourth embodiment, as illustrated in FIGS. 12 and 13, the bump 77 is constituted of the Au layer 77A and the solder layer 77B, and the bump 78 is constituted of the Au layer 78A and the solder layer 78B. In contrast, in the second embodiment, Cu layers (Cu pillars) are used instead of the Au layer 77A and the Au layer 78A. A bump including a Cu pillar and a solder layer arranged on the upper surface of the Cu pillar is referred to as a Cu pillar bump. Although FIGS. 12 and 13 illustrate the cross-sectional shape of the solder layers 77B and 78B as substantially rectangular, after the solder reflow treatment, the side surfaces and the upper surface of the solder layers 77B and 78B become smoothly continuous, resulting in curved surfaces bulging upward.

Figure 16:
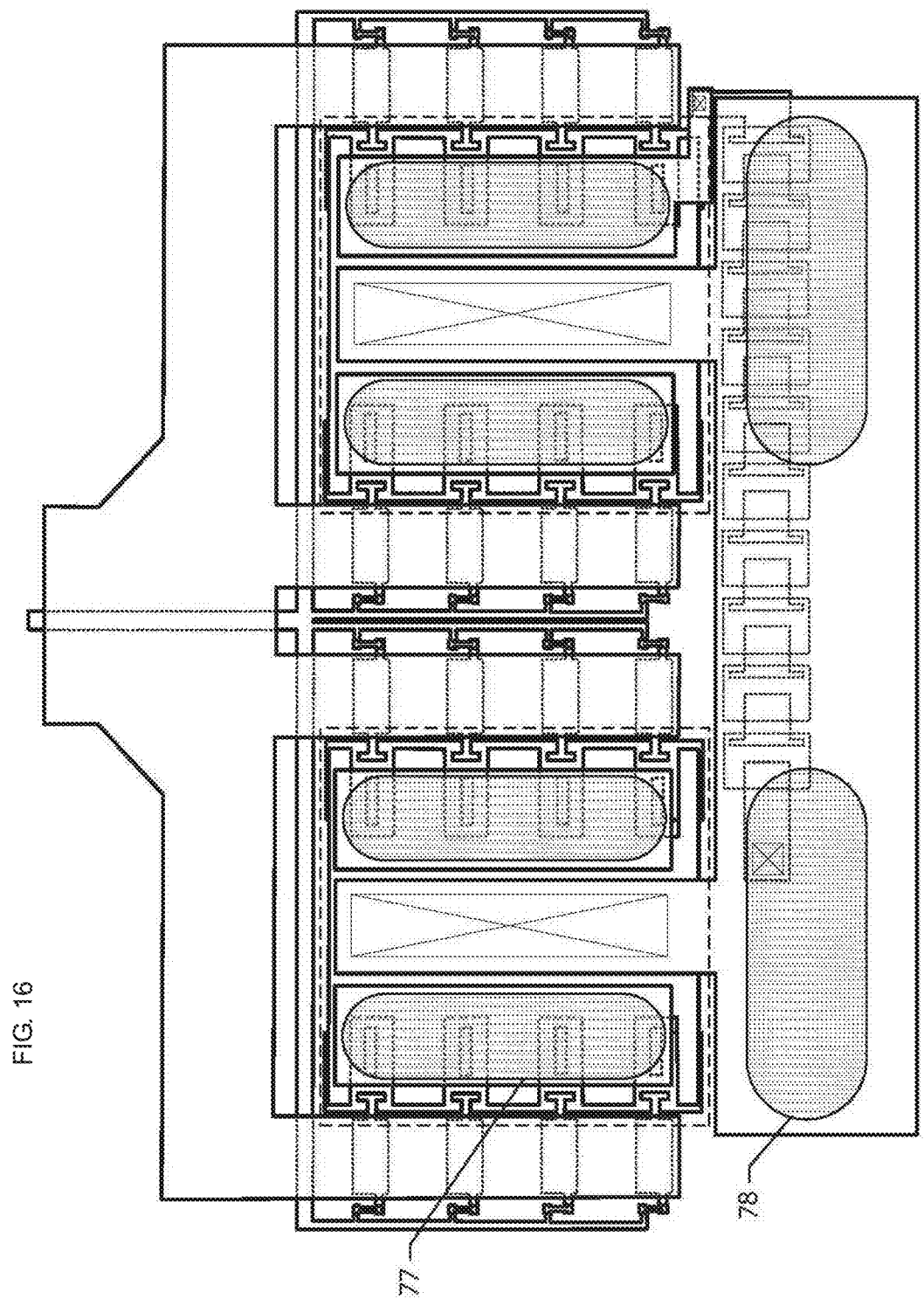
FIG. 16 is a plan view of a semiconductor device according to a third modification of the fourth embodiment.

FIG. 16 is a plan view of a semiconductor device according to a third modification of the fourth embodiment. In the third modification, the planar shape of the bumps 77 for grounding and the bumps 78 for RF output of the semiconductor device according to the first modification (FIG. 14) is changed to substantially rectangular with rounded corners. In addition, Cu pillar bumps are used for the bumps 77 and 78, like the second modification (FIG. 15).

Advantageous effects that are the same as or similar to those of the fourth embodiment are also achieved in the first, second, and third modifications of the fourth embodiment. Like the semiconductor devices according to the second and third modifications, if the planar shape of the bumps 77 and 78 is changed to substantially rectangular with rounded corners, the bumps can be processed and formed stably to have substantially the same shape as a bump mask shape.

Fifth Embodiment

Next, referring to FIG. 17, a semiconductor device according to a fifth embodiment will be described. Hereinafter, descriptions of configurations that are common to the semiconductor device according to the fourth embodiment illustrated in FIGS. 11, 12, and 13 will be omitted.

Figure 17:
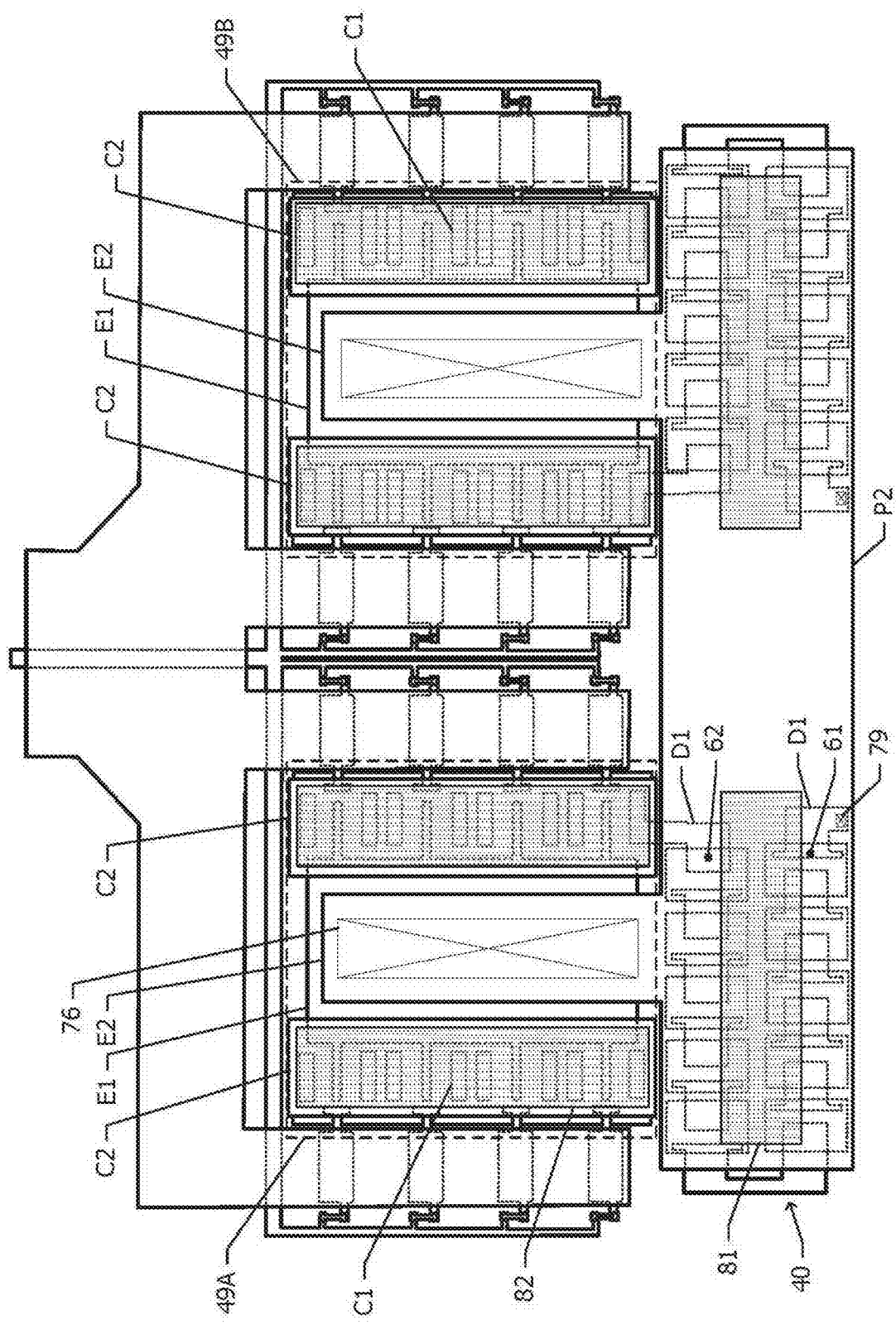
FIG. 17 is a plan view of a semiconductor device according to a fifth embodiment.

FIG. 17 is a plan view of the semiconductor device according to the fifth embodiment. In the fourth embodiment, for each column of HBTs 41, the emitter wire E2 (FIG. 11) on the second layer is arranged just above the HBTs 41. In contrast, in the fifth embodiment, as illustrated in FIG. 17, for each column of HBTs 41, the collector wire C2 on the second layer is arranged just above the HBTs 41. The collector wire C2 is connected to the collector electrodes 57 (FIG. 3B) of each HBT 41 with the collector wires C1 on the first layer interposed therebetween.

One emitter wire E1 on the first layer is arranged for eight HBTs 41 of the first HBT cell block 49A. The emitter wire E2 on the second layer is arranged between the collector wire C2 corresponding to the first column and the collector wire C2 corresponding to the second column. The emitter wire E2 is connected to the emitter wire E1 on the first layer via a contact hole 76 provided in an inter-layer insulating film therebeneath.

The configuration of the emitter wires E1 and E2 and the collector wires C1 and C2 corresponding to the second HBT cell block 49B is the same as the configuration of the emitter wires E1 and E2 and the collector wires C1 and C2 corresponding to the first HBT cell block 49A.

The emitter wires E1 of the first HBT cell block 49A and the second HBT cell block 49B are continuous with the pad conductive layer P2. Of the collector wires C1 on the first layer provided for the HBTs 41 on the second column, the collector wire C1 arranged at the position closest to the pad conductive layer P2 is continuous with the diode wire D1 connected to the anode electrode 62 at the upstream end of the protection circuit 40. The diode wire D1 connected to the cathode electrode 61 at the downstream end of the protection circuit 40 is connected to the pad conductive layer P2 via the interior of a contact hole 79.

Bumps 81 for grounding are arranged on the pad conductive layer P2, and bumps 82 for RF output are arranged on the collector wires C2 on the second layer. Although the bumps 78 for RF output (FIG. 11) overlap the protection circuit 40 in the fourth embodiment, the bumps 81 for grounding may overlap the protection circuit 40, like the fifth embodiment.

Modifications of Fifth Embodiment

Next, referring to FIG. 18, a semiconductor device according to a modification of the fifth embodiment will be described.

Figure 18:
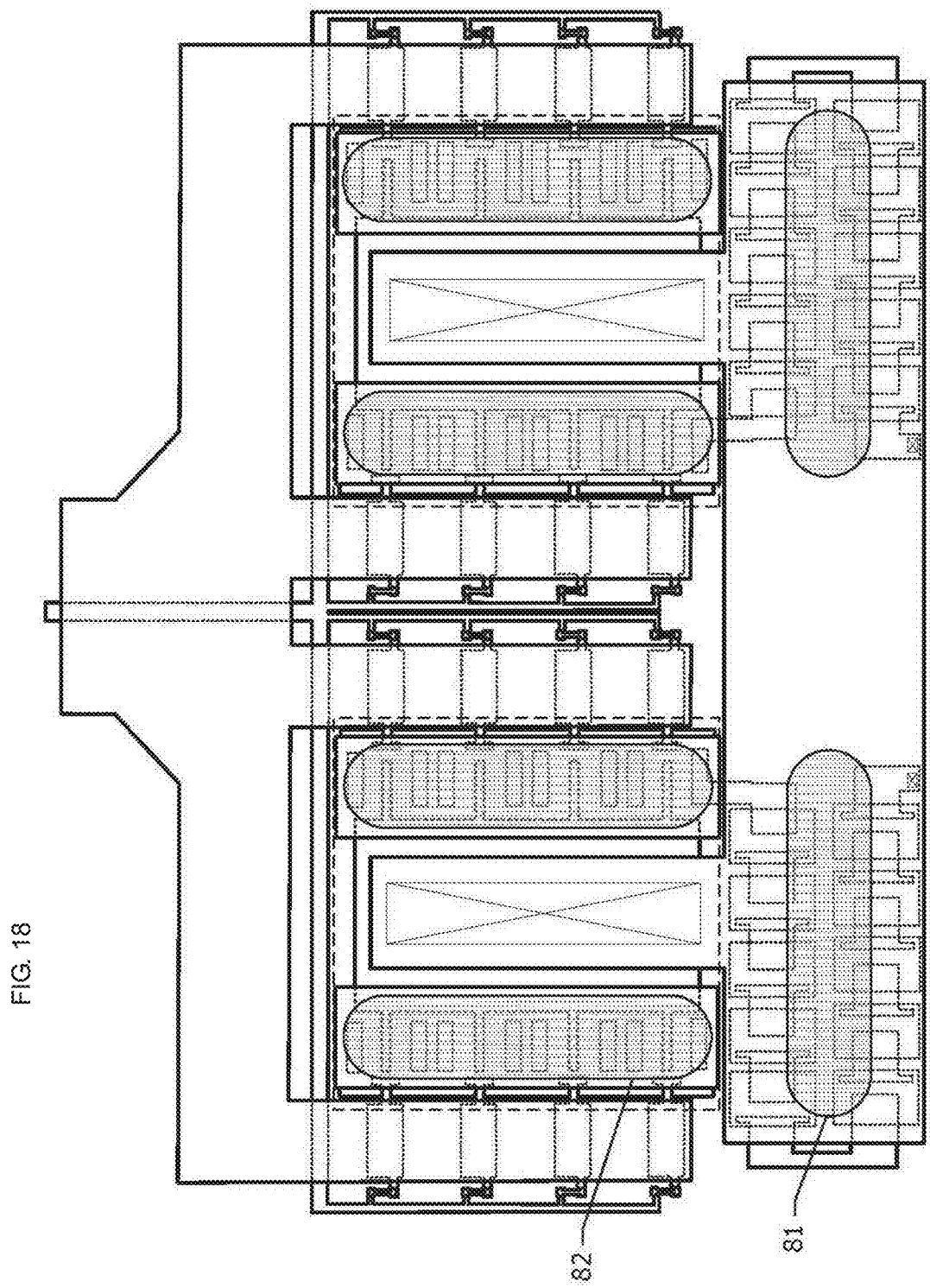
FIG. 18 is a plan view of a semiconductor device according to a modification of the fifth embodiment.

FIG. 18 is a plan view of the semiconductor device according to the modification of the fifth embodiment. In the semiconductor device according to the fifth embodiment, the planar shape of the bumps 81 for grounding and the bumps 82 for RF output (FIG. 17) is substantially rectangular. In contrast, in this modification, the planar shape of the bumps 81 and 82 is substantially rectangular with rounded corners. In addition, Cu pillar bumps are used for the bumps 81 and 82. In the case where the configuration where the bumps 81 for grounding overlap the protection circuit 40 is adopted like the fifth embodiment, Cu pillar bumps whose planar shape is substantially rectangular with rounded corners can be used as the bumps 81 and 82.

Effects of Parasitic Inductance

Next, referring to FIGS. 19A to 20B, the effects of parasitic inductance inserted in series with the protection circuit 40 (FIG. 1B) will be described. The effects of parasitic inductance inserted in series with the protection circuit 40 (FIG. 1B) are obtained by a simulation.

Figure 19A:
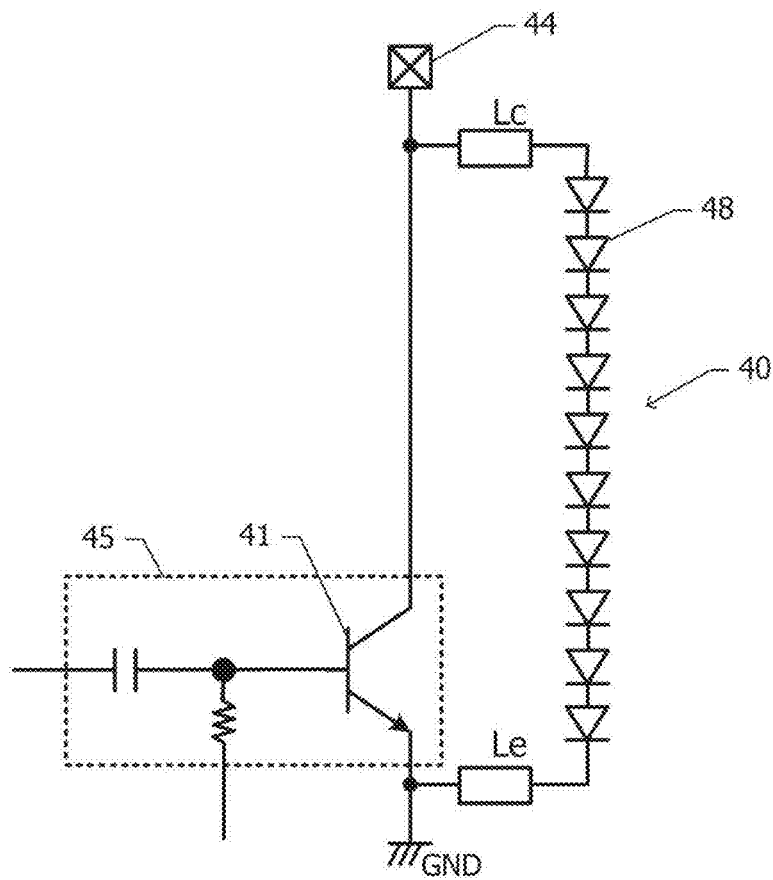
FIG. 19A is an equivalent circuit diagram of an output-stage amplifier circuit serving as a simulation target for simulating the effects of parasitic inductance.

FIG. 19A is an equivalent circuit diagram of an output-stage amplifier circuit serving as a simulation target. The protection circuit 40 is connected between the collector terminal 44 and ground GND. The protection circuit 40 is constituted of ten protection diodes 48 connected in series such that the direction of current flowing from the collector terminal 44 to the ground GND will be the forward direction. It is assumed that a parasitic inductance Lc is inserted between the protection circuit 40 and the collector terminal 44, and a parasitic inductance Le is inserted between the protection circuit 40 and the ground GND.

A simulation of an output voltage is conducted by fluctuating a load on the output-stage amplifier circuit while setting the input voltage to the output-stage amplifier circuit to about 3 dBm, the power supply voltage to about 3.4 V, and the frequency of the RF signal to about 2.5 GHz.

Figure 19B:
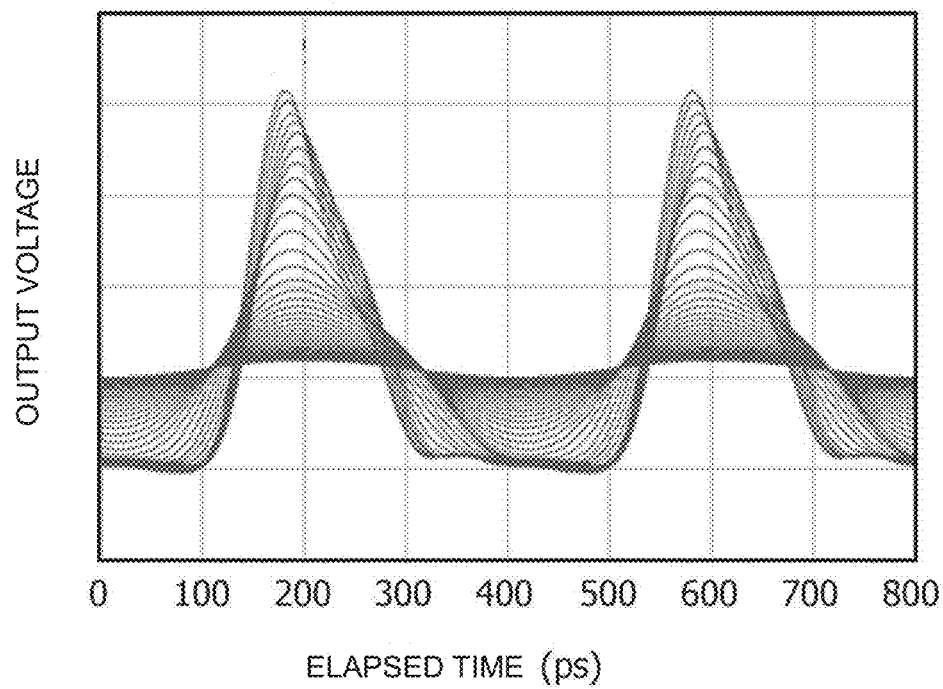
FIG. 19B is a graph illustrating the result of simulating the waveform of an output voltage.

FIG. 19B is a graph illustrating the result of simulating the waveform of the output voltage. The horizontal axis represents the elapsed time in the unit "ps", and the vertical axis represents the output voltage. One waveform is obtained for a certain load, and a plurality of waveforms are obtained for various loads. It turns out that the peak value of the output voltage fluctuates when the load fluctuates. A voltage value at the time the peak value of the output voltage becomes maximum when the load fluctuates will be referred to as a maximum peak voltage. The maximum peak voltage is calculated by changing the parasitic inductance Lc or Le. The calculated maximum peak value is normalized on the basis of the maximum peak value when the parasitic inductances Lc and Le are both zero.

Figure 20A:
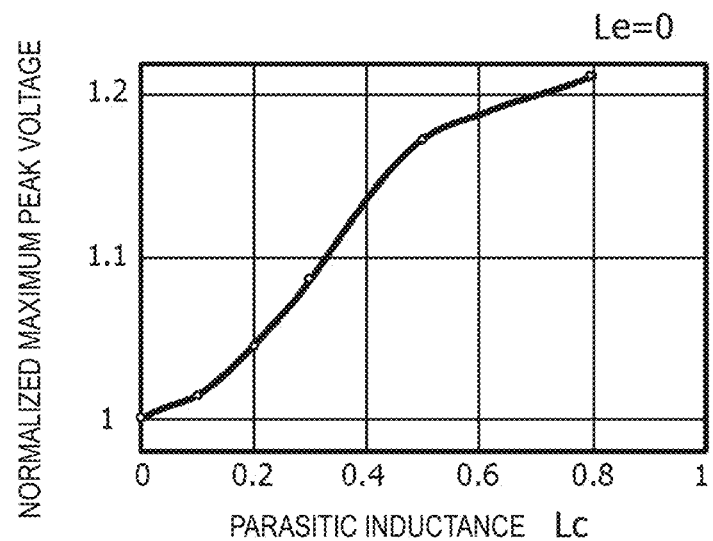
FIG. 20A is a graph illustrating the normalized maximum peak voltage when a parasitic inductance Le is 0 and a parasitic inductance Lc is changed.
Figure 20B:
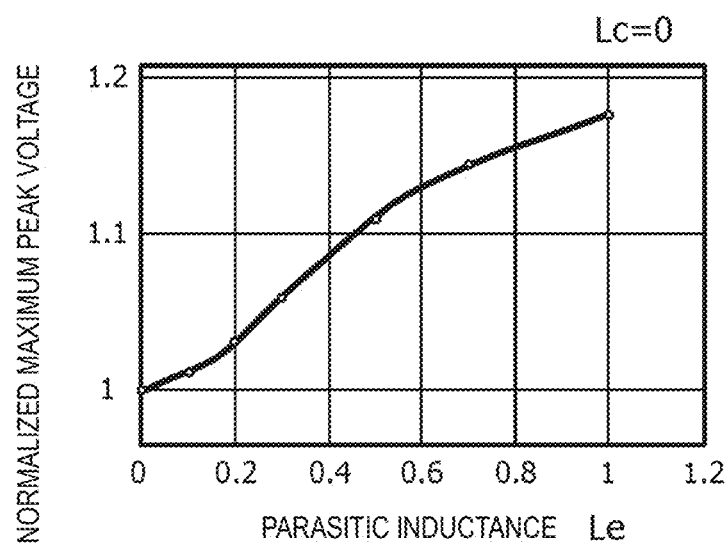
FIG. 20B is a graph illustrating the normalized maximum peak voltage when the parasitic inductance Lc is 0 and the parasitic inductance Le is changed.

FIG. 20A is a graph illustrating the normalized maximum peak voltage when the parasitic inductance Le is 0 and the parasitic inductance Lc is changed. FIG. 20B is a graph illustrating the normalized maximum peak voltage when the parasitic inductance Lc is 0 and the parasitic inductance Le is changed. It turns out in both cases that the normalized maximum peak voltage becomes higher as the parasitic inductance Lc or Le increases. An increase in the normalized maximum peak voltage means that the protection function of the protection circuit 40 is deteriorated. This is because the response characteristics of the protection circuit 40 are deteriorated by the parasitic inductances Lc and Le. To maintain a sufficient protection function of the protection circuit 40, it is preferable to reduce the parasitic inductances Lc and Le.

In the above-described first to fifth embodiments, the protection circuit 40 can be arranged without increasing the distance from the protection circuit 40 to the collector electrodes 57 of each HBT 41 (FIG. 3B) and the distance from the protection circuit 40 to the emitter electrode 59 of each HBT 41 (FIG. 3B). Therefore, a sufficient protection function can be maintained while suppressing an increase in the parasitic inductances Lc and Le.

Effects of Parasitic Resistance

Next, referring to FIGS. 21A and 21B, a simulation result of the input voltage and the output voltage at the time a parasitic resistance Rc of the collector wire of the HBT 41 changes will be described.

Figure 21A:
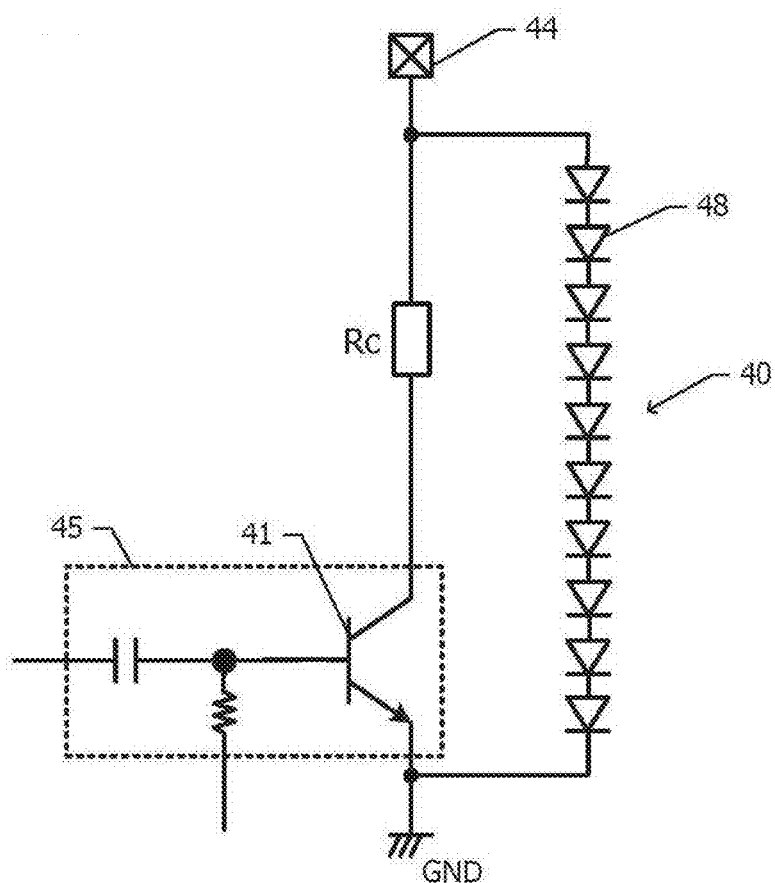
FIG. 21A is an equivalent circuit diagram of an amplifier circuit serving as a simulation target for simulating the effects of parasitic resistance.

FIG. 21A is an equivalent circuit diagram of an amplifier circuit serving as a simulation target. It is assumed that the parasitic resistance Rc is inserted between the collector of the HBT 41 and the collector terminal 44. The relationship between the input voltage and the output voltage is obtained by a simulation while increasing the parasitic resistance Rc by 20 mΩ. The frequency of the input signal is set to about 2.5 GHz, and the power supply voltage is set to about 3.4 V.

Figure 21B:
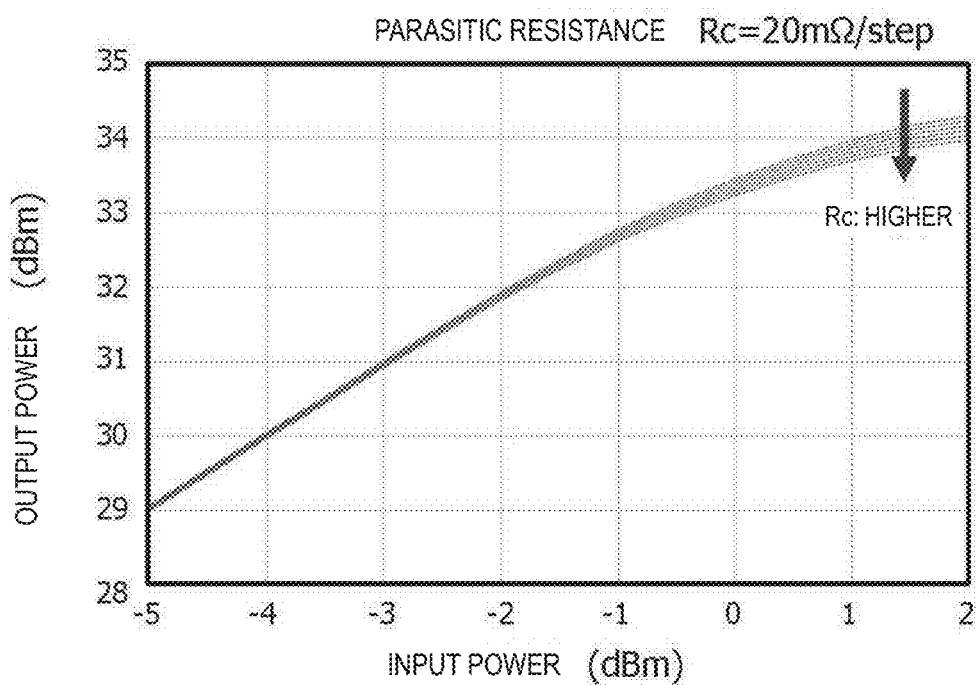
FIG. 21B is a graph illustrating the simulation result.

FIG. 21B is a graph illustrating the simulation result. The horizontal axis represents the input voltage in the unit "dBm", and the vertical axis represents the output voltage in the unit "dBm". It turns out that the output voltage becomes lower as the parasitic resistance Rc becomes greater. The reduction of the output voltage is caused by the following reason. A voltage drop occurs with the parasitic resistance Rc due to collector current flowing at the time of higher power. Due to this voltage drop, an effective collector voltage Vce of the HBT 41 decreases. As a result, the output voltage decreases. To suppress the reduction of the output voltage, it is preferable to reduce the parasitic resistance Rc.

In the above-described first to fifth embodiments, the HBTs 41 and the pads 65 for collector terminal can be arranged close to each other. Therefore, an increase in the parasitic resistance Rc can be suppressed. As a result, it is possible to suppress performance deterioration of the output-stage amplifier circuit.

Further Examples

Figure 27:
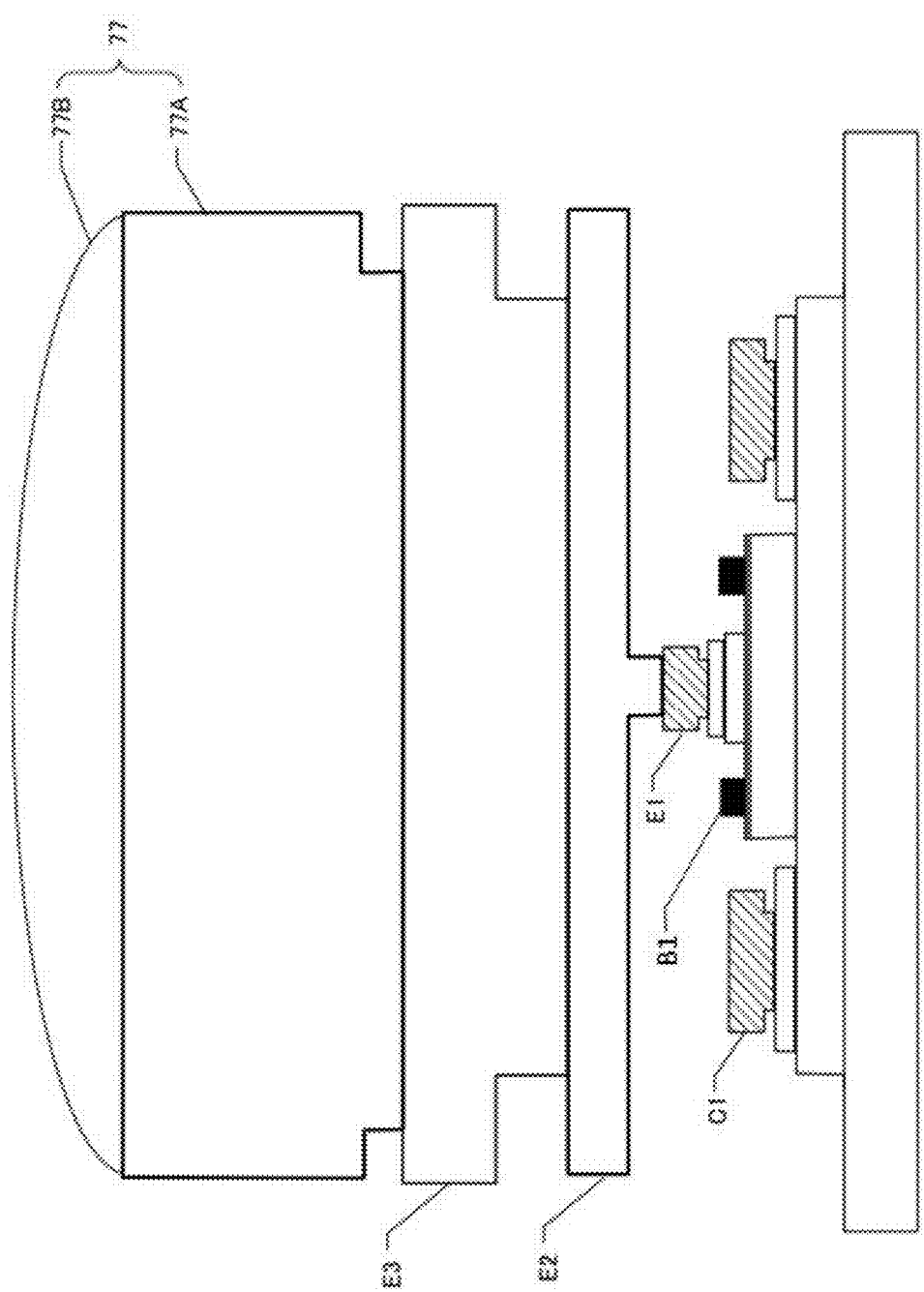
FIG. 27 is a sectional view of an HBT used in the semiconductor circuit implemented in the sixth and seventh embodiments.

In the cross-sectional view illustrated in FIG. 27, unlike the cross-sectional views illustrated in FIG. 3B and FIG. 12, a third emitter wire E3 is added, besides the first emitter wire E1 and the second emitter E2. Although not illustrated in FIG. 27, a third collector wire C3 is also added. That is, this configuration is a configuration that enables three-layer wiring. A sixth embodiment and a seventh embodiment are implemented using three-layer wiring.

Sixth Embodiment

Next, a semiconductor device according to the sixth embodiment will be described with reference to FIG. 28. Hereinafter, a description of a configuration common to the configuration of the semiconductor device according to the fifth embodiment illustrated in FIG. 17 and FIG. 18 will be omitted.

Figure 28:
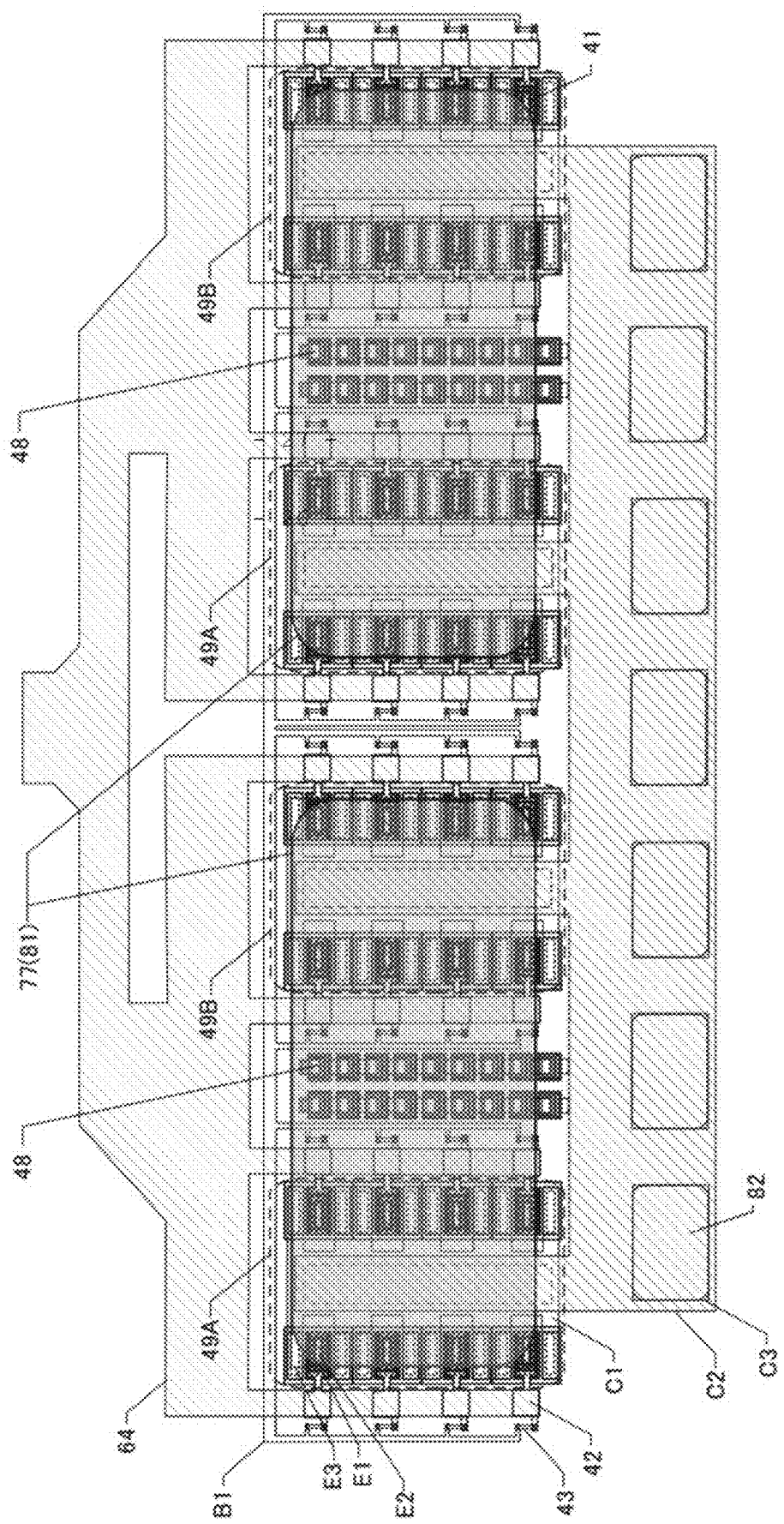
FIG. 28 is a plan view of a semiconductor device according to the sixth embodiment.

FIG. 28 is a plan view of the semiconductor device according to the sixth embodiment. In the fifth embodiment, as illustrated in FIG. 17, the bumps 77 (81) for grounding overlap the protective circuit 40, and the bumps 82 for RF output overlap so as to cover eight HBTs 41 of the first HBT cell block 49A. In contrast, in the sixth embodiment, as illustrated in FIG. 28, eighteen protection diodes 48 are arranged side by side between eight HBTs 41 of the first HBT cell block 49A and eight HBTs 41 of the second cell block 49B. The bumps 77 (81) for grounding in the sixth embodiment are arranged to at least partially overlap part of the first HBT cell block 49A, the second HBT cell block 49B, and the protection diodes 48. Note that the bumps 77 (81) for grounding are connected to the first emitter wire E1 and the second emitter wire E2 of the HBTs 41 with the third emitter wire E3 interposed therebetween.

The collectors of the first HBT cell block 49A and the second HBT cell block 49B are connected to the bumps 82 for RF output with the second collector wire C2 and the third collector wire C3 interposed therebetween. In some example embodiments, at least one of the bumps may be formed in a shape, such as an ellipse shape. In some embodiments, the bumps may be arranged relative to one another, such as a bump 77 (81) for grounding being arranged parallel to a bump 82 for RF output, or a third bump being arranged parallel to one or both of a bump 77 (81) for grounding or a bump 82 for RF output. In FIG. 28, the bumps 82 for RF output are arranged parallel to the bumps 77 (81) for grounding.

An interlayer insulating film is formed over the layer 2 wiring comprising the emitter wire E2 and the collector wire C2, openings are formed in the interlayer insulating film, and a layer 3 wiring is formed over the interlayer insulating film formed on the layer 2 wiring and into openings. Thereafter, the layer 3 wiring is patterned to form the third emitter wire E3 and the third collector layer C3, which are insulated from one another. The third collector layer C3 is sometimes referred to herein as a pad conductive layer P3.

An insulating protective film, such as the protective film 68 described herein, is formed to cover the pad conductive layer P3 and another area such as the third emitter wire E3, and at least one opening is formed in the insulating protective film to expose a partial area of a surface of the pad conductive layer P3 and the third emitter wire E3. Bumps 77 (81) and 82 are formed to respectively contact the emitter wire E3 and the pad conductive layer P3 at bottom surfaces of the respective openings formed in the insulating protective film. The bump 77 (81) is configured to be connected to ground potential (GND) and the bump 82 is configured to be connected to a circuit outside the substrate 50, for example, for receiving RF output from the bump 82. A bump 77 (81) for grounding may be referred to as a second bump, and a bump 82 for RF output may be referred to as a first bump.

Although the protection diodes 48 are aligned with one another in FIG. 28, the layout of the protection diodes 48 may be folded, for example, at a middle of the diode array, as illustrated in FIGS. 26A and 26B. Although the bumps 82 for RF output are seven bumps in the sixth embodiment, some example embodiments may feature a different number of bumps.

In some example embodiments, the bump 77 (81) is connected to ground and to the amplifier circuit, and the bump 77 (81) may at least partially overlap the protection circuit in plan view. In some example embodiments, the bump 77 (81) may at least partially overlap a transistor included in an amplifier circuit to which the protection circuit is connected. In some example embodiments, at least part of the protection circuit may be arranged outside the bump 77 (81) for grounding.

In plan view as illustrated in FIG. 28, the bumps 77 (81) for grounding may at least partially overlap the protection diodes 48, the first HBT cell block 49A, and the second HBT cell block 49B, thereby allowing heat to be dissipated from the bumps 77 (81) for grounding to electrodes connected thereto. This enables prevention of destruction of the HBTs 41 by heat, as well as a rise in temperature due to heat generation of the protection diodes 48.

Seventh Embodiment

Next, a semiconductor device according to the seventh embodiment will be described with reference to FIG. 29. Hereinafter, a description of a configuration common to the configuration of the semiconductor device according to the sixth embodiment will be omitted. In the sixth embodiment illustrated in FIG. 28, even the protection diodes 48, which are arranged between the first HBT cell block 49A and the second HBT cell block 49B, are arranged to overlap the bumps 77 (81) for grounding. In contrast, in the seventh embodiment illustrated in FIG. 29, the first HBT cell block 49A in which the HBTs 41 are aligned, and, in parallel to the first HBT cell block 49A, nine protection diodes 48 are arranged. The bump 77 (81) for grounding is arranged to at least partially overlap the first HBT cell block 49A, the input capacitors 42, the ballast resistors 43, and part of the protection diodes 48. Note that the bump 77 (81) for grounding is connected to the first emitter wire E1 and the second emitter wire E2 of the HBTs 41 with the third emitter wire E3 interposed therebetween.

The collectors of the HBTs 41 are connected to the bumps 82 for RF output with the collector wire C2 and the collector wire C3 interposed therebetween. In some example embodiments, at least one of the bumps may be formed in a shape, such as an ellipse shape. In some embodiments, the bumps may be arranged relative to one another, such as a bump 77 (81) for grounding being arranged parallel to a bump 82 for RF output, or a third bump being arranged parallel to one or both of a bump 77 (81) for grounding or a bump 82 for RF output. In FIG. 29, the bumps 82 for RF output are arranged parallel to the bump 77 (81) for grounding.

Although the protection diodes 48 are aligned with one another in FIG. 29, the layout of the protection diodes 48 may be folded, for example, at a middle of the diode array, as illustrated in FIGS. 26A and 26B. Although the bumps 82 for RF output are six bumps in the seventh embodiment, some example embodiments may feature a different number of bumps.

In some example embodiments, the bump 77 (81) may at least partially overlap the protection circuit in plan view. In some example embodiments, the bump 77 (81) may at least partially overlap a transistor included in an amplifier circuit to which the protection circuit is connected. In some example embodiments, at least part of the protection circuit may be arranged outside the bump 77 (81) for grounding.

In plan view as illustrated in FIG. 29, the bump 77 (81) for grounding may at least partially overlap the protection diodes 48, and the first HBT cell block 49A, thereby allowing heat to be dissipated from the bump 77 (81) for grounding to electrodes connected thereto. This enables prevention of destruction of the HBTs 41 by heat, as well as a rise in temperature due to heat generation of the protection diodes 48.

Further Examples

The above-described embodiments are exemplary, and, needless to say, a partial replacement or combination of configurations discussed in different embodiments is possible. The same or similar advantageous effects achieved by the same or similar configurations in a plurality of embodiments will not be mentioned in each of the embodiments. Furthermore, the present disclosure is not limited to the above-described embodiments. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
an amplifier circuit including a semiconductor element formed on a substrate;
a protection circuit including a plurality of protection diodes that are formed on the substrate and that are connected in series with each other, the protection circuit being connected to an output terminal of the amplifier circuit;
a pad conductive layer at least partially including a pad for connecting to a circuit outside the substrate;
an insulating protective film covering the pad conductive layer, the insulating protective film including an opening that exposes a partial area of a surface of the pad conductive layer, the insulating protective film covering another area;
a first bump formed on the pad conductive layer on a bottom surface of the opening; and
a second bump at least partially overlapping the protection circuit in plan view and connected to a ground (GND) potential connected to the amplifier circuit.

2. The semiconductor device according to claim 1, wherein the second bump at least partially overlaps a transistor included in the amplifier circuit.

3. The semiconductor device according to claim 2, wherein at least one of the bumps is formed in an ellipse shape.

4. The semiconductor device according to claim 1, wherein the plurality of protection diodes form a diode array folded back in a middle of the diode array in plan view, and part of the protection circuit is arranged outside the second bump.

5. The semiconductor device according to claim 2, wherein the plurality of protection diodes form a diode array folded back in a middle of the diode array in plan view, and part of the protection circuit is arranged outside the second bump.

6. The semiconductor device according to claim 3, wherein the plurality of protection diodes form a diode array folded back in a middle of the diode array in plan view, and part of the protection circuit is arranged outside the second bump.

7. The semiconductor device according to claim 1, wherein the plurality of protection diodes form a diode array of diodes that are aligned with one another, and part of the protection circuit is arranged outside the second bump.

8. The semiconductor device according to claim 2, wherein the plurality of protection diodes form a diode array of diodes that are aligned with one another, and part of the protection circuit is arranged outside the second bump.

9. The semiconductor device according to claim 3, wherein the plurality of protection diodes form a diode array of diodes that are aligned with one another, and part of the protection circuit is arranged outside the second bump.

10. The semiconductor device according to claim 1, the first bump being arranged parallel to the second bump.

11. The semiconductor device according to claim 2, the first bump being arranged parallel to the second bump.

12. The semiconductor device according to claim 3, the first bump being arranged parallel to the second bump.

13. The semiconductor device according to claim 1, further comprising a third bump, the third bump being arranged parallel to one or both of the first bump or the second bump.

14. The semiconductor device according to claim 2, further comprising a third bump, the third bump being arranged parallel to one or both of the first bump or the second bump.

15. The semiconductor device according to claim 3, further comprising a third bump, the third bump being arranged parallel to one or both of the first bump or the second bump.

* * * * *